(12) United States Patent
Nakamura

(10) Patent No.: US 6,710,387 B2
(45) Date of Patent: Mar. 23, 2004

(54) SEMICONDUCTOR DEVICE AND METHOD FOR FABRICATING THE SAME

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/140,115

(22) Filed: May 8, 2002

(65) Prior Publication Data

US 2002/0127810 A1 Sep. 12, 2002

Related U.S. Application Data

(62) Division of application No. 09/815,011, filed on Mar. 23, 2001.

(30) Foreign Application Priority Data

May 29, 2000 (JP) ........................................ 2000-158258

(51) Int. Cl.[7] .............................................. H01L 29/72

(52) U.S. Cl. ...................... 257/296; 257/304; 257/307; 257/350; 257/532; 257/773

(58) Field of Search ................................ 257/296, 304, 257/307, 350, 532, 773

(56) References Cited

U.S. PATENT DOCUMENTS 5,849,619 A 12/1998 Cho et al.
6,204,191 B1 * 3/2001 Jung et al. .................. 257/296

* cited by examiner

*Primary Examiner*—Edward Wojciechowicz
(74) *Attorney, Agent, or Firm*—Westerman, Hattori, Daniels & Adrian, LLP

(57) ABSTRACT

A semiconductor device comprising: a storage electrode having a side wall forward tapered; a capacitor dielectric film formed on the side wall of the storage electrode; and a plate electrode formed on the side wall of the storage electrode with the capacitor dielectric film interposing therebetween, the plate electrode having a side wall inversely tapered.

9 Claims, 35 Drawing Sheets

SEMICONDUCTOR DEVICE AND METHOD FOR FABRICATING THE SAME

This application is a divisional of prior application Ser. No. 09/815,011 filed Mar. 23, 2001.

BACKGROUND OF THE INVENTION

The present invention relates to a semiconductor device fabrication technique, more specifically a semiconductor device having DRAM-type memory elements, and a method for fabricating the same.

A DRAM is a semiconductor memory device which can be formed of memory cells each having one transistor and one capacitor. Various structures and fabrication methods have been conventionally studied for semiconductor memory devices of higher density and higher integration. Especially a structure of the capacitors of DRAM much influences the integration, and it is significant how to ensure a required storage capacitance without preventing higher integration of the device.

A conventional method for fabricating a DRAM-type semiconductor device will be explained with reference to FIGS. 32A–32B, 33A–33B, 34A–34B, and 35A–35B. FIGS. 32A–32B, 33A–33B, 34A–34B, and 35A–35B are sectional views of the semiconductor device in the steps of the method for fabricating the same.

First, in the same way as in the usual method for fabricating a MOS transistor, a memory cell transistor including a gate electrode 102 and source/drain diffused layers 104, 106, and a peripheral circuit transistor including a gate electrode 108 and a source/drain diffused layer 110 are formed on a silicon substrate 100.

Next, a bit line 114 and an interconnection layer 116 are formed on an inter-layer insulation film 118 covering the memory cell transistor and the peripheral circuit transistor, electrically connected respectively to the source/drain diffused layer 104 through a plug 112, and to the gate electrode 108 or to the source/drain diffused layer 110.

Then, an inter-layer insulation film 120 is formed on the inter-layer insulation film 118, on which the bit line 114 and the interconnection layer 116 are formed.

Next, a plug 124 is buried in the inter-layer insulation films 120, 118, electrically connected to the source/drain diffused layer 106 through a plug 122 (FIG. 32A).

Then, on the inter-layer insulation film 120 with the plug 124 buried in, an etching stopper film 126 of a silicon nitride film, an inter-layer insulation film 128 of a silicon oxide film, and a mask film 130 of an amorphous silicon film are formed by, e.g., CVD method.

Then, the mask film 130, the inter-layer insulation film 128 and the etching stopper film 126 are patterned by the lithography and etching to form an opening 132 which arrives at the plug 124 (FIG. 32B).

A conducting film 134, such as a Ru (Ruthenium) film, SRO (SrRuO$_3$) film or others, is formed on the entire surface by, e.g., CVD method.

Then, a silicon oxide film 136 is deposited on the entire surface by, e.g., CVD method and etched back by, e.g., CMP method or dry etching to fill the opening 132 with the conducting film 134 formed in by the silicon oxide film 136 (FIG. 33A).

Next, the surfaces of the conducting film 134, the silicon oxide film 136 and mask film 130 are uniformly retreated by CMP method or dry etching until the inter-layer insulation film 128 is exposed. Thus, a cylindrical storage electrode 138 of the conducting film 134 is formed in the opening 132 (FIG. 33B).

Then, the silicon oxide film 136 and the inter-layer insulation film 128 are selectively etched with the etching stopper film 126 as a stopper to expose the inside and outside walls of the storage electrode (FIG. 34A).

Then, a dielectric film of, e.g., Ta$_2$O$_5$ film or BST film on the entire surface by, e.g., CVD method to form a capacitor dielectric film 140 of the dielectric film, covering the storage electrode 138.

Next, annealing is performed to sufficiently crystallize the capacitor dielectric film 140, and thermal oxidation is performed to supplement oxygen defects in the capacitor dielectric film 140 (FIG. 34B). Conditions for the thermal processing are different depending on dielectric materials forming the capacitor dielectric film 140, but the processing at a high temperature of 500–850° C. is necessary.

Next, a conducting film, such as an Ru film or SRO film, is deposited on the entire surface by, e.g., CVD method and patterned to form a plate electrode 142 of the conducting film, covering the storage electrode 138 interposing the capacitor dielectric film 140 therebetween (FIG. 35A).

Thus, a capacitor including the storage electrode 138, the capacitor dielectric film 140 and the plate electrode 142 and connected electrically to the source/drain diffused layer 106 of the memory cell transistor is formed.

Next, a silicon oxide film is deposited on the entire surface by, e.g., CVD method to form an inter-layer insulation film 144 of the silicon oxide film.

Next, as required, an interconnection layer 146 and an interconnection layer 148 are formed, connected respectively to the plate electrode 142 and to the interconnection layer 116 (FIG. 35B).

Thus, a DRAM comprising memory cells each including one transistor and one capacitor is fabricated.

As described above, in the conventional semiconductor device fabrication method, crystallization of the capacitor dielectric film 140 is improved for higher dielectric constant, or for low leak current, high-temperature thermal processing is performed after the capacitor dielectric film 140 has been formed.

However, such thermal processing can improve film quality of the capacitor dielectric film 140, but on the other hand deteriorate electric characteristics between the storage electrode 138 and the plug 124.

In a case, for example, that the plug 124 is formed of doped polycrystalline silicon, a silicide layer formed in the contact region between the storage electrode 138 and the plug 124 aggregate, reducing a contact area, with a result of increase of the contact resistance. Often a dopant of the plug 124 is absorbed by the silicide layer, forming a region of a lower dopant concentration on the upper end of the plug 124, with a result of higher contact resistance.

In a case that the thermal processing in an oxidizing atmosphere is necessary, when the plug 124 is formed of doped polycrystalline silicon, or a metal, such as W (tungsten), the contact region of the plug 124 is oxidized, with a result of increased contact resistance.

In order to suppress such contact resistance increase, it is considered that a barrier metal, as of a TiN film, is formed on the top of the plug 124, but the step of forming the barrier metal must be added. Fabrication cost increase is inevitable. Depending on kinds of the storage electrode 138 and the capacitor dielectric film 140, oxidizing ability in the thermal processing is too high to select a suitable barrier metal for preventing the oxidation.

In the thermal processing, materials forming the plug 124 are diffused in the storage electrode 138 to deteriorate compatibility between the storage electrode 138 and the capacitor dielectric film 140, often with a result of decreased breakdown voltage and increased capacitor leak current.

The above-described problems will be solved by lowering crystallization annealing temperature and the thermal processing temperature for the capacitor dielectric film 140. However, the thermal processing at low temperatures is not sufficient for the crystallization and supplement of oxygen defects, with results of decreased dielectric constants of the capacitor dielectric film 140 or increased leak current. The crystallization annealing and thermal oxidation for the capacitor dielectric film 140 will have to be performed at higher temperature as the capacitor dielectric film 140 is thinner. Accordingly, also for further micronization of semiconductor devices it is required to prohibit the influence of the thermal processing.

SUMMARY OF THE INVENTION

An object of the present invention is to provide a semiconductor device and a method for fabricating the semiconductor device which can prohibit electric characteristic deterioration between the storage electrodes and the lower electrodes, etc. connected to the storage electrodes in the steps of crystallization annealing and oxidizing the capacitor dielectric film.

According to one aspect of the present invention, there is provided a method for fabricating a semiconductor device comprising the steps of: forming a first insulation film above a substrate; forming a first opening in the first insulation film down to the substrate; forming a plate electrode on at least a side wall of the first opening; removing the first insulation film to form a second opening having a side wall surrounded by the plate electrode; forming a capacitor dielectric film on at least the side wall of the second opening; and forming a storage electrode on the capacitor dielectric film formed on the side wall of the second opening.

According to another aspect of the present invention, there is provided a semiconductor device comprising: a storage electrode having a side wall forward tapered; a capacitor dielectric film formed on the side wall of the storage electrode; and a plate electrode formed on the side wall of the storage electrode interposing the capacitor dielectric film therebetween, the plate electrode having a side wall inversely tapered.

According to the present invention, insulation film is formed on a substrate, a first opening is formed in the insulation film down to the substrate, a plate electrode is formed on at least the side wall of the first opening, the first insulation film is removed to form a second opening having the side wall surrounded by the plate electrode, a capacitor dielectric film is formed on at least the side wall of the second opening, and a storage electrode is formed on the side wall of the second opening through the capacitor dielectric film, whereby electric characteristics between the electrode, etc. in the below structure and the storage electrode are prevented from deterioration in high-temperature thermal processing in the step of forming the capacitor dielectric film.

The thermal processing can be performed without taking into consideration electric characteristics between the lower electrode and the storage electrode, whereby the thermal processing can be performed under conditions which are optimum for the capacitor dielectric film, and the capacitor dielectric film can have higher dielectric constant and higher film quality.

DETAILED DESCRIPTION OF THE INVENTION

A Principle of the Invention

Figure 1A:
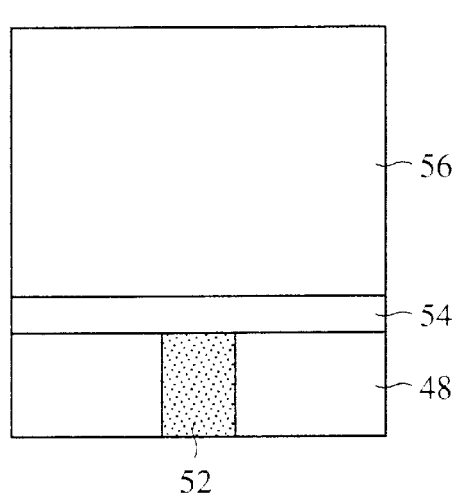
FIGS. 1A–1D and 2A–2D are sectional views of the semiconductor device in the steps of the method for fabricating the same, which explain the principle of the present invention.

The principle of the present invention will be explained with reference to FIGS. 1A–1D and 2A–2D. FIGS. 1A–1D and 2A–2D are sectional views of the semiconductor device according to the present invention in the steps of the method for fabricating the same, which explain the principle.

The present invention is characterized mainly in that a capacitor dielectric film is formed after a plate electrode has been formed, and then a storage electrode is formed.

The principle of the present invention will be explained by means of an example that a storage electrode 72 electrically connected to a plug 52, a capacitor dielectric film 70 and a plate electrode 62 are formed on a base structure with the plug 52 buried in an inter-layer insulation film 48.

First, an etching stopper film 54 of, e.g., a silicon nitride film, and an inter-layer insulation film 56 of, e.g., a silicon oxide film are formed on an inter-layer insulation film 48 with a plug 52 buried in (FIG. 1A).

Figure 1B:
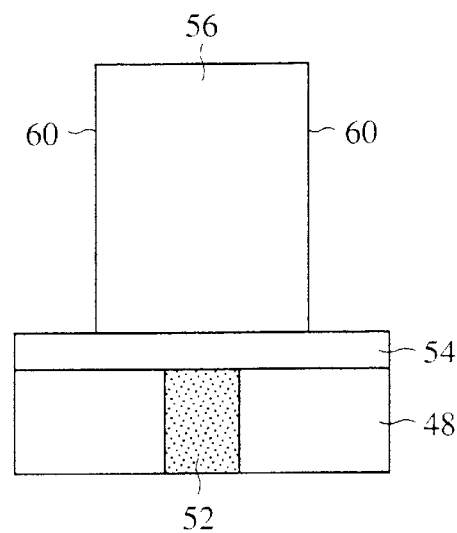

Next, the inter-layer insulation film 56 is patterned to form an opening 60 in the inter-layer insulation film 56. At this time, the inter-layer insulation film 56 is etched with the etching stopper film 54 as a stopper. The opening 60 is formed in a region for a plate electrode 62 is to be formed (FIG. 1B). In FIG. 1B, parts of two openings 60 are shown.

Figure 1C:
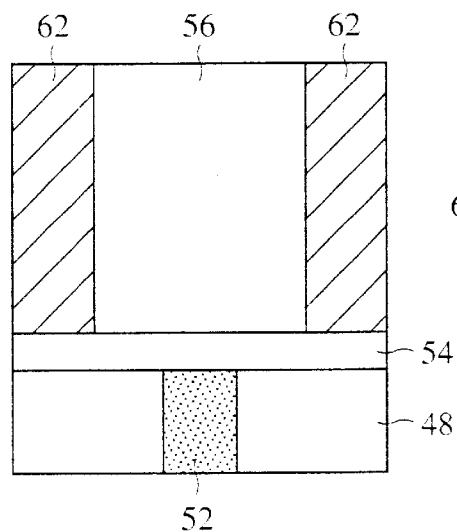

Next, a conducting film is buried in the opening 60 to form a plate electrode 62 of the conducting film (FIG. 1C). The plate electrode 62 may be formed by depositing the conducting film and patterning the same, but as will be described later, the process of burying the conducting film in the inter-layer insulation film 56 to form the plate electrode 62 has a significant merit of facilitating the fabrication of the semiconductor device while global flatness is maintained.

Figure 1D:
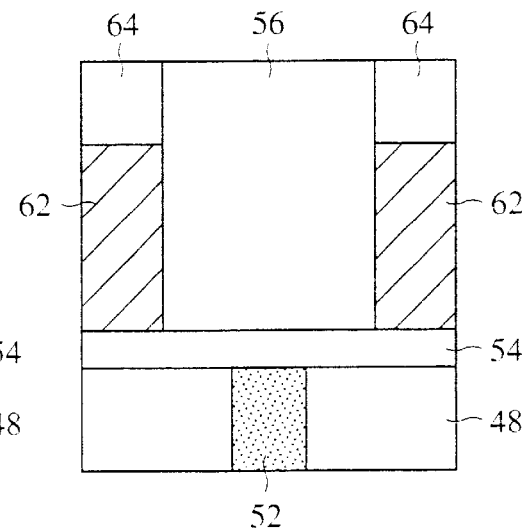

Next, the top of the plate electrode 62 is a little retreated, and then a silicon nitride film 64, for example, having etching characteristics different from those of the inter-layer insulation film 56 is buried in the opening 60 on the plate electrode 62 (FIG. 1D).

Figure 2A:
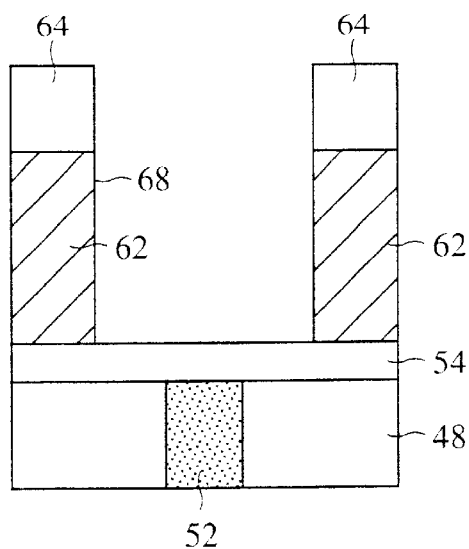

Then, the inter-layer insulation film 56 is removed selectively with respective to the silicon nitride film 64, the plate electrode 62 and the etching stopper film 54 to form an opening 68 (FIG. 2A).

Next, a dielectric film is deposited and etched back to form a capacitor dielectric film 70 of the dielectric film on the inside wall of the opening 68.

Figure 2B:
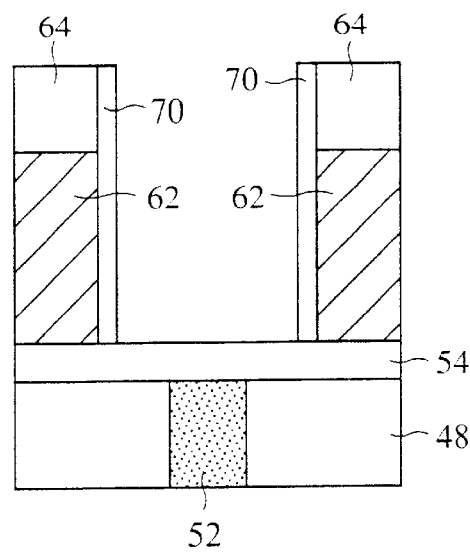

Then, thermal processing for crystallizing the capacitor dielectric film 70 or supplementing oxygen defects thereof is performed (FIG. 2B). At this time, the plug 52, the upper surface of which is covered by the etching stopper film 54 of the silicon nitride film, is not oxidized. Neither aggregation of a silicide layer formed between 52 and a storage electrode 72, nor transition of the dopant takes place between the two takes place because the storage electrode 72 is not formed yet.

Figure 2C:
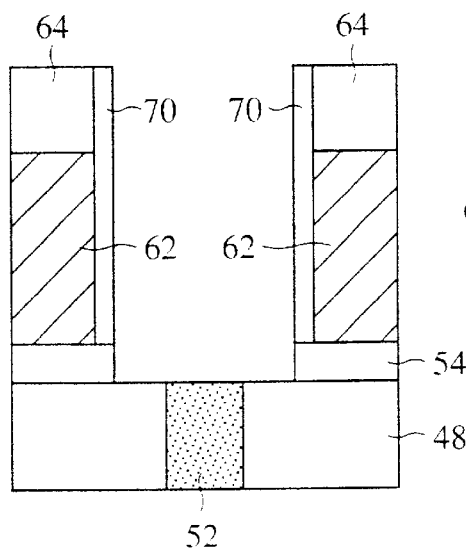

Next, the etching stopper film 54 in the opening 68 is selectively removed to expose the plug 52 in the opening 68 (FIG. 2C).

Figure 2D:
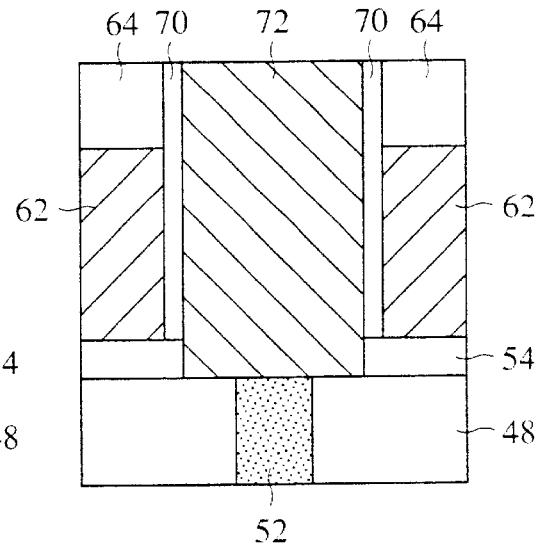

Then, a conducting film is buried in the opening 68 to form the storage electrode 72 of the conducting film, electrically connected to the plug 52 (FIG. 2D).

In fabricating the semiconductor device in such process, the thermal processing for crystallizing the capacitor dielectric film 70 or supplementing oxygen defects thereof is not performed after the plug 52 and the storage electrode 72 have been connected to each other, whereby electric characteristics, etc. between the plug 52 and the storage electrode 72 are prevented from being deteriorated by the thermal processing. The plug 52, which has been already covered by the time of the thermal processing, is not oxidized. Accordingly, the thermal processing for crystallizing the capacitor dielectric film 70 or supplementing oxygen defects thereof can be performed under conditions suitable for the capacitor dielectric film 70 without considering electric characteristics between the plug 52 and the storage electrode 72. Thus, the capacitor dielectric film 70 having high dielectric constant and little leak current can be easily formed.

The semiconductor device fabrication method shown in FIGS. 1A–1D and 2A–2D requires the etching step of FIG. 2C for removing the etching stopper film 54, and there is a risk that the capacitor dielectric film 70 might have plasma damage. However, the capacitor dielectric film 70 is free from serious damage because the capacitor dielectric film 70 is parallel with a direction of movement of the ions. The capacitor dielectric film 70 is a little damaged by ion implantation and charge-up, but such damages can be removed by thermal processing at relatively low temperatures of about 400–450° C.

In order to make the dielectric film 70 invulnerable to such damage it is very effective that the inter-layer insulation film 56 is patterned to inversely taper the side wall of the opening 60 in the step of FIG. 1D, so that the opening 68 has a diameter increased toward the plug 52.

In the specification, "inversely tapered" means that the bottom surface and the side wall of the opening form an acute angle, and "forward tapered" means that the bottom surface and the side wall of the opening form an obtuse angle. When "inversely tapered" and "forward tapered" are used for an electrode, "inversely tapered" means that the bottom surface and the side wall of the electrode form an acute angle, and "forward tapered" means that the bottom surface and the side wall of the electrode form an obtuse angle.

In a case that the thermal processing is not performed in an oxidizing atmosphere, the thermal processing for crystallizing the capacitor dielectric film 70 may be performed after the etching stopper film 54 in the opening 68 is removed, and the plug 52 is exposed. The thermal processing for the crystallization may be performed after the capacitor dielectric film 70 is deposited, following the removal of the etching stopper film 54 in the opening 68.

The present invention is applicable not only to connecting the storage electrode 72 to the plug 52, but also to connecting the storage electrode 72 to plugs lower of the plug 52 or the silicon substrate. It is not essential that the opening is completely buried by the storage electrode 72 and the plate electrode 62.

A First Embodiment

The semiconductor device and the method for fabricating the same according to a first embodiment of the present invention will be explained with reference to FIGS. 3A–3B, 4A–4E, 5A–5C, 6A–6B, 7A–7B, 8A–8B, and 9.

Figure 3A:
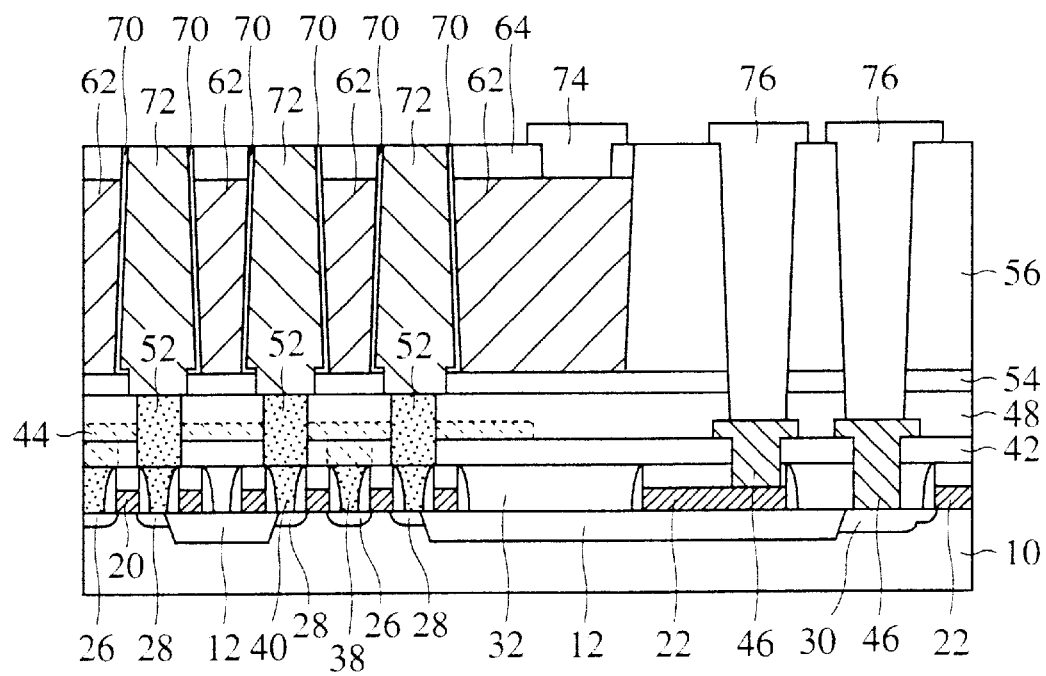
FIG. 3A is a diagrammatic sectional view of the semiconductor device according to a first embodiment of the present invention, which shows a structure thereof.
Figure 3B:
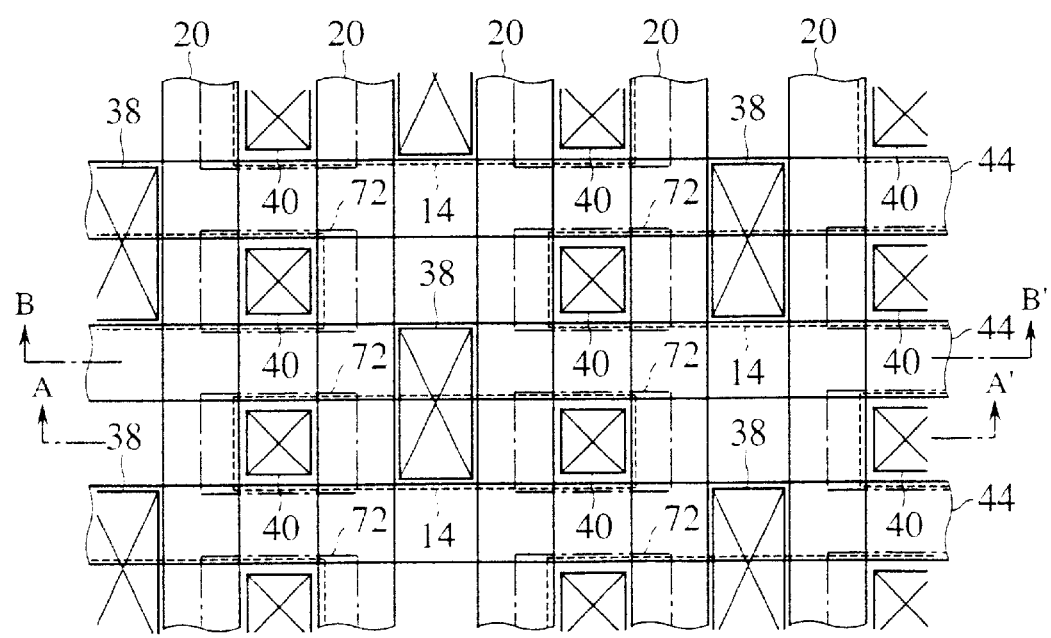
FIG. 3B is a plan view of the semiconductor device according to the first embodiment of the present invention, which shows a structure thereof.

FIGS. 3A and 3B are views of the semiconductor device according to the present embodiment, which shows a structure thereof. FIGS. 4A–4E, 5A–5C, 6A–6B, 7A–7B, and 8A–8B are sectional views of the semiconductor device according to the present embodiment in the steps of the method for fabricating the same, which show the method. FIG. 9 is a view of an example of patterns of the photoresist film used in the method for fabricating the semiconductor device according to the present embodiment.

First, the structure of the semiconductor device according to the present embodiment will be explained with reference to FIGS. 3A and 3B. FIG. 3A is a diagrammatic sectional view of the semiconductor device according to the present embodiment, which shows the structure thereof. FIG. 3B is a plan view of a memory cell region corresponding to the region on the left side of FIG. 3A and has a scale different from FIG. 3A.

A device isolation film 12 defining device regions 14, 16 is formed on a silicon substrate 10. A memory cell transistor comprising a gate electrode 20 and source/drain diffused layers 26, 28 and a peripheral circuit transistor comprising a gate electrode 22 and a source/drain diffused layer 30 are formed respectively in the device regions 14, 16. An inter-layer insulation films 32, 42 are formed on the silicon substrate 10 with the memory cell transistor and the peripheral circuit transistor formed on. On the inter-layer insulation film 42 there are formed a bit line 44 connected to the source/drain diffused layer 26 through a plug 38, and an interconnection layer 46 connected to the gate electrode 22 or the source/drain diffused layer 30. An inter-layer insulation film 48 is formed on the inter-layer insulation film 42 with the bit line 44 and the interconnection layer 46 formed on. A pillar-shaped storage electrode 72 is formed on the inter-layer insulation film 48, connected to the source/drain diffused layer 28 through a plug 52 and a plug 40. A plate electrode 62 is buried between the storage electrodes 72 interposing a capacitor dielectric film 70 therebetween. A silicon nitride film 64 is formed on the plate electrode 62. On the inter-layer insulation film 48 of the peripheral circuit region, a silicon nitride film 54 and an inter-layer insulation film 62 are formed. An interconnection layer 74 is formed on the silicon nitride film 54, connected to the plate electrode 62. An interconnection layer 76 is formed on the inter-layer insulation film 56, connected to the gate electrode 22 or the source/drain diffused layer 30 through the interconnection layer 46.

The semiconductor device of such DRAM-type according to the present embodiment is characterized mainly in that the storage electrode 72 has the side wall forward tapered, and the plate electrode 62 has the side wall inversely tapered. This structure is attributed to the fabrication method characteristic of the present invention, and enables the capacitor dielectric film 70 to have improved film quality, and can make a parasitic capacitance between the bit line 44 and the storage electrode 72 small.

Next, the method for fabricating the semiconductor device according to the present embodiment will be explained with reference to FIGS. 4A–4E, 5A–5C, 6A–6B, 7A–7B, 8A–8B and 9. The sectional views of the memory cell region in FIGS. 4A–4E, 5A–5C, 6A–6B, 7A–7B and 8A–8B are along the line A–A' in FIG. 3B unless especially described.

First, the device isolation film 12 is formed on the primary surface of a semiconductor substrate 10 by, e.g., STI (Shallow Trench Isolation) technique to define the device regions 14, 16. Here, the device region 14 indicates an active region of a memory cell region constituting a memory cell transistor, and the device region 16 indicates an active region of a peripheral circuit region constituting a peripheral circuit transistor.

Next, a gate insulation film (not shown) is formed of a silicon oxide film on the device regions 14, 16 by, e.g., thermal oxidation.

Then, a polycrystalline silicon film and a silicon nitride film are sequentially deposited on the entire surface by, e.g., CVD method, and the laid films are patterned to form the gate electrodes 20, 22 having the upper surfaces covered by the silicon nitride film 18. Here, the gate electrode 20 is the gate electrode of the memory cell transistor, and the gate electrode 22 is the gate electrode of the peripheral circuit transistor.

Next, with the gate electrode 20 as a mask, ions are implanted into the silicon substrate 10 to form the source/drain diffused layers 26, 28 in the silicon substrate 10 on both sides of the gate electrode 20. With the gate electrode 22 as a mask, ions are implanted into the silicon substrate 10 to form an LDD region or an extension region in the silicon substrate 10 on both sides of the gate electrode 22.

Then, a silicon nitride film or a silicon oxide film is deposited on the entire surface by, e.g., CVD method and is etched back to form a sidewall insulation film 24 on the side walls of the gate electrodes 20, 22 and the silicon nitride film 18.

Next, with the gate electrode 22 and the sidewall insulation film 24 as a mask, ions are implanted into the silicon substrate 10 to form the source/drain diffused layer 30 in the silicon substrate 10 on both sides of the gate electrode 22.

Figure 4A:
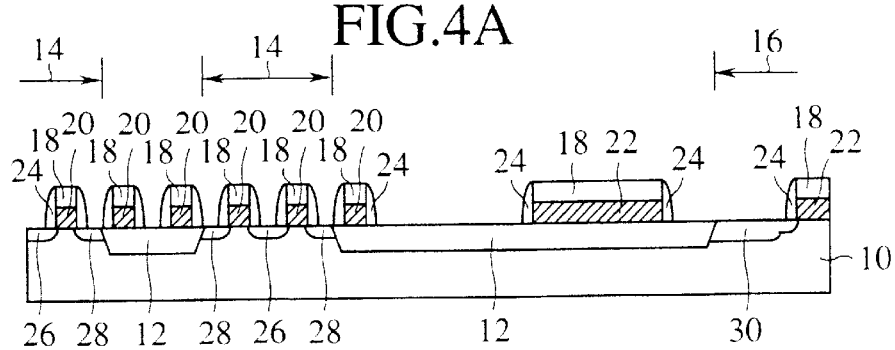
FIGS. 4A–4E, 5A–5C, 6A–6B, 7A–7B, and 8A–8B are sectional views of the semiconductor device according to the first embodiment of the present invention in the steps of the method for fabricating the same, which show the method.

Thus, the memory cell transistor comprising the gate electrode 20 and the source/drain diffused layers 26, 28 formed in the silicon substrate 10 on both sides of the gate electrode 20 is formed in the device region 14, and the peripheral circuit transistor comprising the gate electrode 22 and the source/drain diffused layer 30 formed in the silicon substrate 10 on both sides of the gate electrode 22 is formed in the device region 16 (FIG. 4A).

Then, a silicon oxide film is deposited on the entire surface by, e.g., CVD method, and the surface of the silicon oxide film is polished by CMP (Chemical Mechanical Polishing) or other means until the silicon nitride film 18 is exposed, to form the inter-layer insulation film 32 having the surface planarized.

Figure 4B:
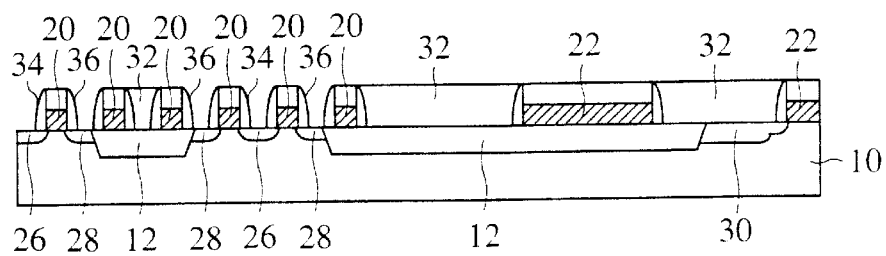

Next, by the lithography and etching, the contact hole 34 and the contact hole 36 are formed in the inter-layer insulation film 32 respectively down to the source/drain diffused layer 26 and down to the source/drain diffused layer 28 (FIG. 4B).

Figure 4C:
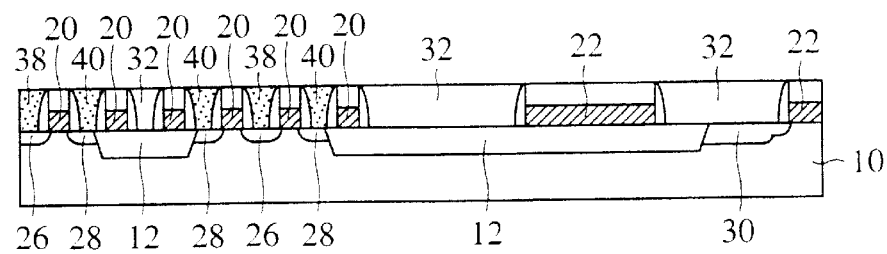

Then, the plugs 38, 40 are buried in the contact holes 34, 36 opened in the inter-layer insulation film 32 (FIG. 4C). For example, a polycrystalline silicon film is deposited by CVD method and etched back to be left only in the contact holes 34, 36, and is doped by ion implantation to be made low resistivity. The plugs 38, 40 of the doped polycrystalline silicon are formed. The plugs 38, 40 are positioned in the same plane in FIG. 4C, but actually are often positioned in different planes.

Next, a 50–100 nm-thick silicon oxide film is deposited on the entire surface by, e.g., CVD method to form the inter-layer insulation film 42 of the silicon oxide film.

Figure 4D:
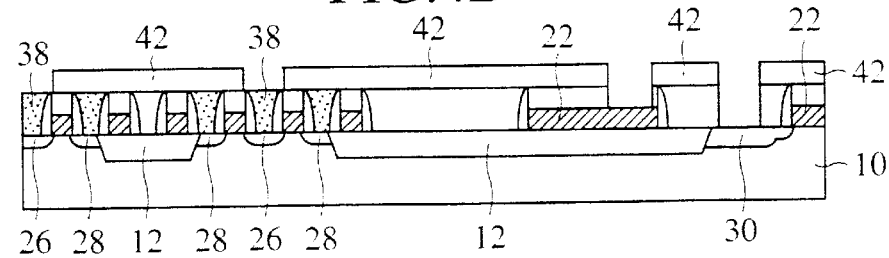

Next, the contact hole formed in the inter-layer insulation film 42 down to the plug 38, the contact hole formed in the inter-layer insulation film 42 and the silicon nitride film 18 down to the gate electrode 22, and he contact hole formed in the inter-layer insulation film 42, 32 down to the source/drain diffused layer 30 are formed by the lithography and etching (FIG. 4D).

In FIG. 4D, for the convenience of the explanation, the contact holes arrive at the plug 38 formed in the inter-layer insulation film 42. Actually, however, the contact holes are not positioned in the same plane along the plug 38 and the plug 40. The structure upper of the inter-layer insulation film 42 including the inter-layer insulation film 42 in FIG. 4D is along the sectional view along the line B–B' in FIG. 3B.

Figure 4E:
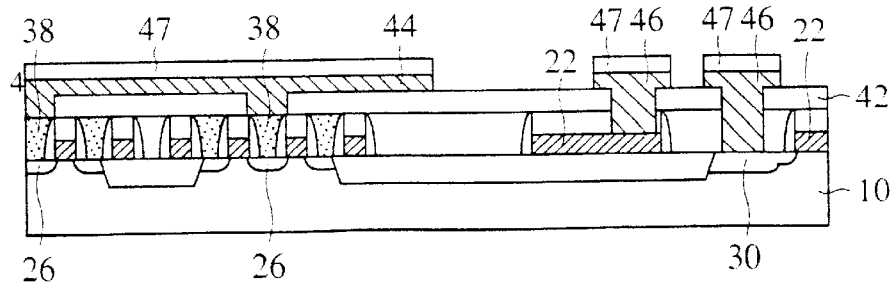

Then, a TiN (titanium nitride) film, a W (tungsten) film and a silicon nitride film are sequentially deposited on the entire surface by CVD method and are patterned to form the bit line 44 having the upper surface covered by the silicon nitride film 47 and connected to the source/drain diffused layer 26 through the plug 38, and an interconnection layer 46 having the upper surface covered by the silicon nitride film 47 and connected to the gate electrode 22 or the source/drain diffused layer 30 (FIG. 4E).

In FIG. 4E, for the convenience of the explanation, the bit line 44 is described in the shown section, but actually is positioned in plane different from that where the plug 40 is positioned, as same as the contact holes formed in the inter-layer insulation film 42. The structure upper of the inter-layer insulation film 42 including the inter-layer insulation film 42 in FIG. 4E is the section along the line B–B' in FIG. 3B.

Then, a silicon nitride film is deposited on the entire surface by, CVD method, and is etched back to form a sidewall insulation film (not shown) on the side walls of the bit line 44 and the silicon nitride film 47.

Next, a silicon oxide film is deposited on the entire surface by, e.g., CVD method, and the surface of the silicon oxide film is polished until the silicon nitride film 47 is exposed to form the inter-layer insulation film 48 having the surface planarized.

Figure 5A:
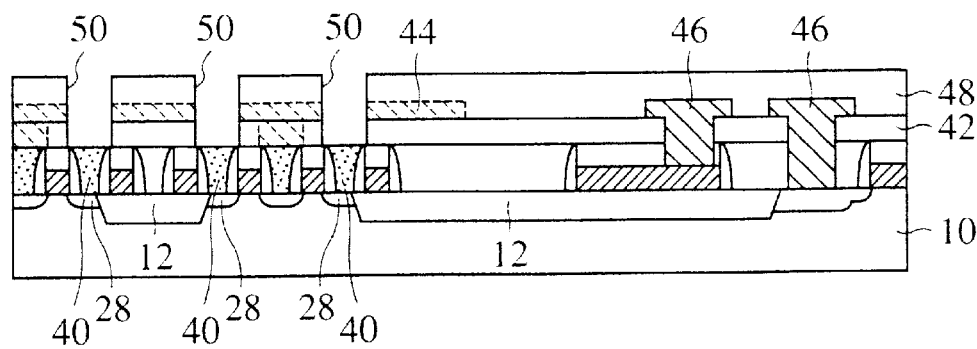

A contact hole 50 is formed in the inter-layer insulation films 48, 42 down to the plug 40 by the lithography and etching (FIG. 5A). The contact hole 50 is opened by self-alignment with the silicon nitride film 47 formed on the bit line 44 and the sidewall insulation film (not shown) formed on the side wall of the bit line 44. In FIG. 5A and the followers, the bit line 44 is indicated by the dotted line, because the bit line 44 does not appear in the shown section.

Figure 5B:
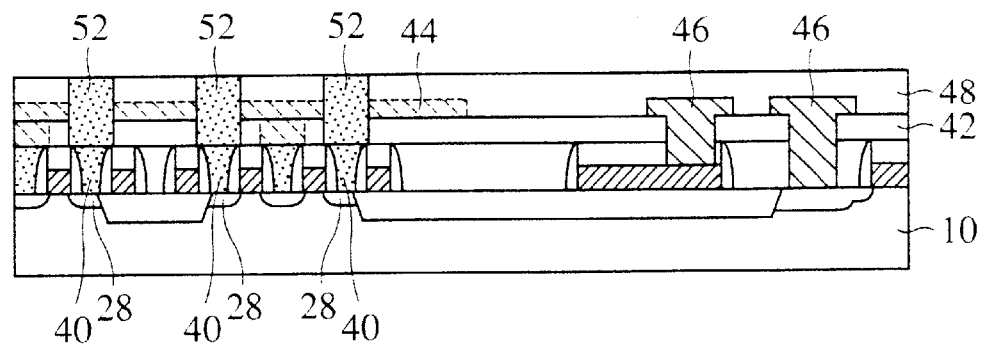

Next, the plug 52 is buried in the contact hole 50 opened in the inter-layer insulation films 42, 48 (FIG. 5B). For example, a Ti (titanium) film, a TiN film and a W film are sequentially deposited by CVD method, and the W film and TiN film are left in the contact hole 50 by CMP method or etching back to form the plug 52. For the convenience of the explanation, the plug 52 and the bit line 44 are shown in the same plane, but actually the plug 52 and the bit line 44 are positioned in different planes from each other and are electrically insulated from each other by the inter-layer insulation films 42, 48, etc.

Next, an about 50–200 nm-thick silicon nitride film is formed on the inter-layer insulation film 48 by, e.g., CVD method to form the etching stopper film 54 of the silicon nitride film.

Then, a silicon oxide film is deposited on the etching stopper film 54 by, e.g., CVD method to form the inter-layer insulation film 56 of the silicon oxide film. A thickness of the inter-layer insulation film 56 is suitably set in accordance with a required capacitance. For example, when a design rule (half a pitch between the word lines and between the bit lines) is 0.13 $\mu$m, a capacitance of 1 cell is 30 fF, and a thickness of the capacitor dielectric film is 1.2 nm, a thickness of the inter-layer insulation film 56 is 0.8–0.9 $\mu$m.

Next, an amorphous silicon film is deposited on the inter-layer insulation film 56 by, e.g., CVD method to form a mask film 58 of the amorphous silicon film. The mask film 58 is formed in consideration of a case that a photoresist film may not provide by itself sufficient masking in etching the thick inter-layer insulation film 56. The mask film may not be essentially formed when the photoresist film has sufficient resistance.

Figure 5C:
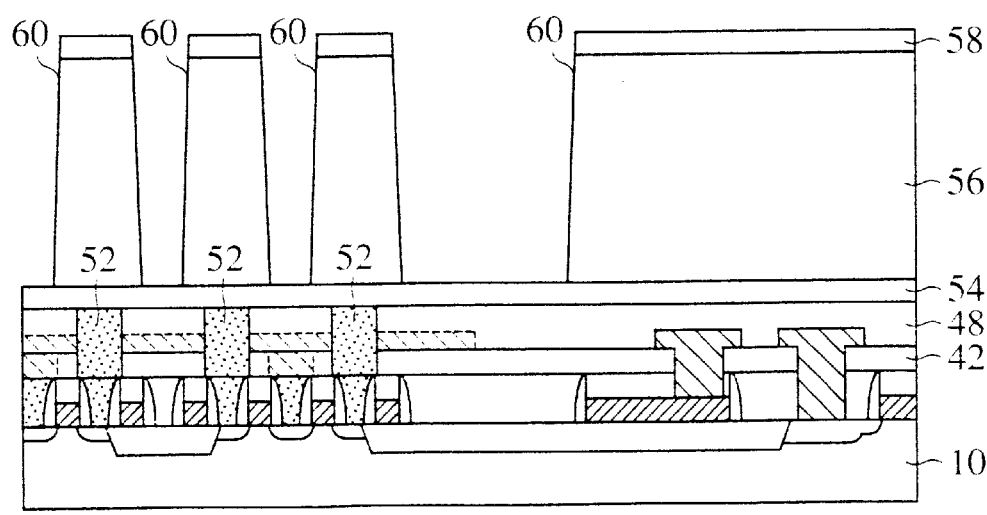

Then, the mask film 58 and the inter-layer insulation film 56 are patterned by the lithography and etching to form an opening 60 down to the etching stopper film 54 (FIG. 5C). The opening 60 will be filled with the plate electrode 62 in a later step and is formed in a mesh as shown in FIG. 9.

At this time, with the etching stopper film 54 below as an etching stopper, the mask film 58 and the inter-layer insulation film 56 are etched such that the opening 60 can have the side wall forward tapered. The side wall of the opening 60 can be forward tapered by anisotropic etching which uses $C_4F_8$ gas, CO gas and Ar and is stopped by the etching stopper film 54.

Next, the photoresist film (not shown) used in forming the opening 60 is removed by, e.g., plasma ashing, and the mask film 58 of the amorphous silicon film is removed by, e.g., dry etching.

Figure 6A:
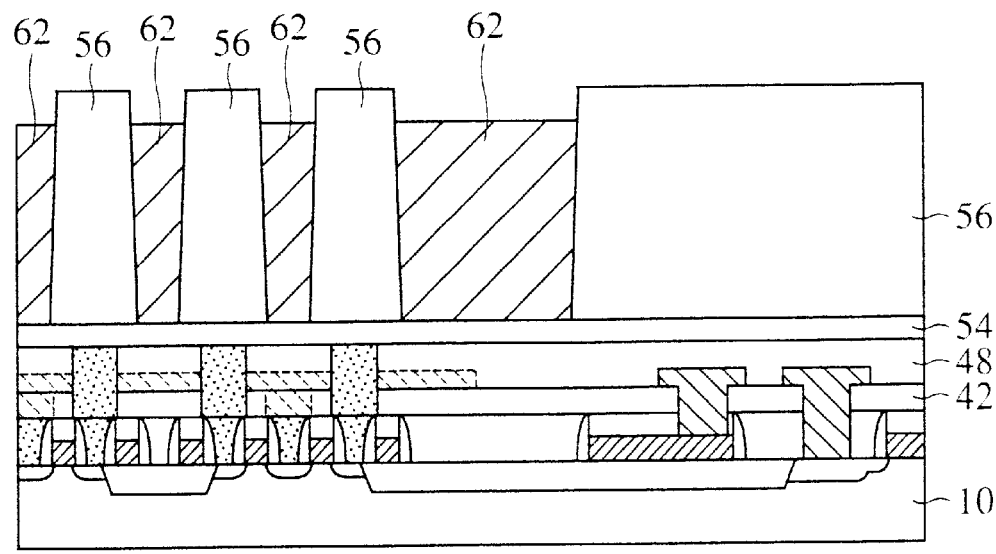

Then, a conducting film to be the plate electrode is deposited on the entire surface by, e.g., CVD method, and the conducting film on the inter-layer insulation film 56 is selectively removed by CMP method or etching back to form the mesh-shaped plate electrode 62 of the conducting film and buried in the opening 60. At this time, the conducting film is over-etched until the surface of the plate electrode 62 is lower than the surface of the inter-layer insulation film 56 by about 100–300 nm (FIG. 6A). The over-etching is for decreasing leak current between the plate electrode 62 and the storage electrode 72, which is formed later. A thickness of the inter-layer insulation film described above must be set in consideration of an amount of the over-etching. The over-etching is not essential.

A material of the conducting film forming the plate electrode 62 is suitably selected in accordance with compatibility with the capacitor dielectric film, which is to be formed later. For example, when the capacitor dielectric film is a dielectric film as of $Ta_2O_5$, the plate electrode 62 can be formed of Ru (ruthenium), WN (tungsten nitride) or others. When the capacitor dielectric film is a dielectric film as of BST, the plate electrode 62 can be formed of Pt (platinum), Ru, SRO($SrRuO_3$) or others. When the capacitor dielectric film is a dielectric film as of ON ($SiO_2$/SiN) or others, the plate electrode 62 can be formed of doped polycrystalline silicon or others. When the capacitor dielectric film is a dielectric film as of PZT, the plate electrode 62 can be formed of Pt or others. In the present embodiment, the capacitor dielectric film is $Ta_2O_5$ film or BST film, and the plate electrode 62 is formed of Ru.

The side wall of the thus formed plate electrode 62 is inversely tapered, contouring the shape of the side wall of the opening 60.

In the present embodiment, the plate electrode 62 is buried in the opening 60 formed in the inter-layer insulation film 56 for the prevention of the occurrence of a global step between the peripheral circuit region and the memory cell region. The inter-layer insulation film 56 is left in the peripheral circuit region by a height which is substantially the same as the plate electrode 62 (or including the silicon nitride film 64 to be later formed), whereby the following steps can be carried out with the surface of the substrate kept substantially flat. This is very effective in planarization steps and lithography steps in which depth of focus is important.

Figure 6B:
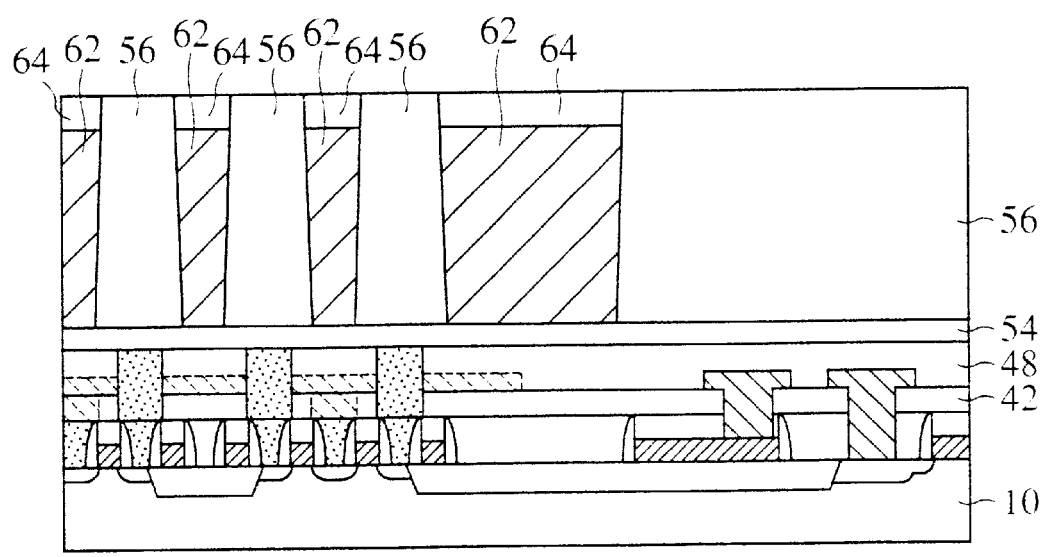

Then, a 200–500 nm-thick silicon nitride film is deposited on the entire surface by, e.g., CVD method, and the silicon nitride film on the inter-layer insulation film 56 is selectively removed by CMP or etching back to bury the silicon nitride film 64 in the opening 60 on the plate electrode 62 (FIG. 6B). The step of burying the silicon nitride film 64 is not essential. In the absence of this step, disadvantageously leak current tends to occur at the upper ends of the storage electrode and the plate electrode between the two, but advantageously the fabrication process can be shortened.

Here, the insulation film buried on the plate electrode 62 is not essentially silicon nitride film. However, considering that the insulation film is used as a mask for removing the inter-layer insulation film 56 in a later step, it is preferable that the insulation film has etching characteristics different from those of the inter-layer insulation film 56.

Then, a photoresist film 66 covering the peripheral circuit region but exposing the memory cell region is formed by the lithography. The photoresist film 66 is laid with the edge positioned on the plate electrode 62 as shown in FIG. 9.

Next, with the photoresist film 66 and the silicon nitride film 64 as a mask, and the etching stopper film 54 as an etching stopper, the inter-layer insulation film 56 is selectively etched. Thus, a pillar-shaped opening 68 for the storage electrode 72 to be formed in is formed in the region of the memory cell region where the inter-layer insulation film 56 has been removed.

This etching can be anisotropic etching, such as RIE or others. However, wet etching using, e.g., an HF-based aqueous solution is preferable in consideration that the insulation film is unnecessarily left on the side wall of the opening due to the inverse taper of the plate electrode 62, the plate electrode 62 is damaged by the ions, etc. It is also possible to perform isotropically etching, such as wet etching or others after the anisotropic etching, such as RIE or others for the purpose of removing unnecessary insulation film left on the side wall of the plate electrode 62.

Next, after the photoresist film 66 is removed, a 10–30 nm-thick $Ta_2O_5$ or BST film is deposited on the entire surface by, e.g., CVD method to form the capacitor dielectric film 70 of the $Ta_2O_5$ or BST film.

Figure 7A:
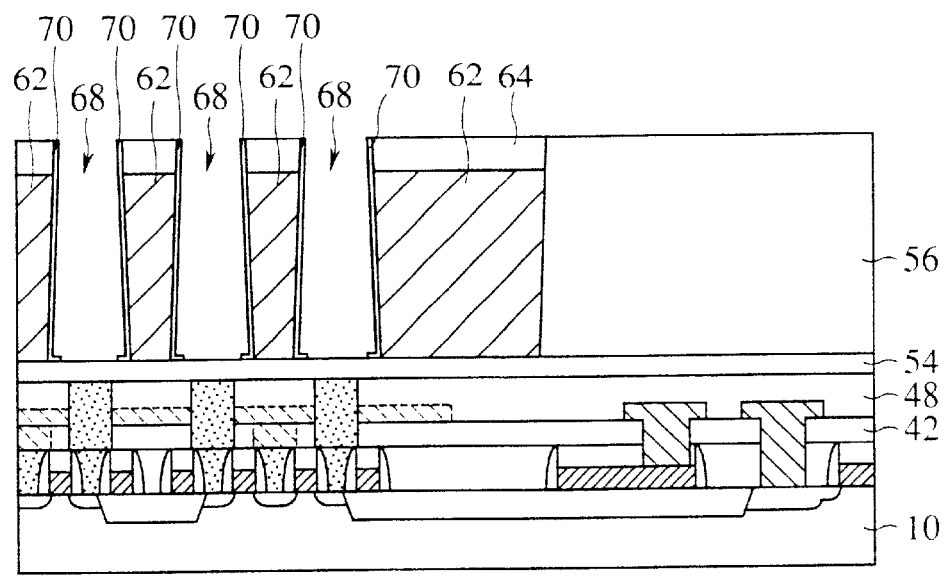

Then, the capacitor dielectric film 70 is anisotropically etched to be left selectively on the side wall of the opening 68 (FIG. 7A).

Then, thermal treatment is performed to sufficiently crystallize the capacitor dielectric film 70 and supplement oxygen defects in the film. The thermal treatment is performed for the capacitor dielectric film 70 of $Ta_2O_5$ film, e.g., in a dry oxygen atmosphere, at a 650–750° C. thermal processing temperature and for 30 minutes of the thermal processing. For the capacitor dielectric film 70 of BST, the thermal processing is performed, e.g., in a dry oxygen atmosphere, at a 500–700° C. thermal processing temperature and for about 30 minutes of the thermal processing.

At this time, the plug 52, which is covered by the etching stopper film 54 of silicon nitride film known as an oxidation mask, is kept from the oxidation. The storage electrode 72 has not been formed yet, and electric characteristics between the plug 52 and the storage electrode 72 are not deteriorated. Accordingly, the high temperature and long time thermal processing required for the crystallization and oxidation of the capacitor dielectric film 70 is allowed to be performed suitably in accordance with requirements of the capacitor dielectric film 70.

Figure 7B:
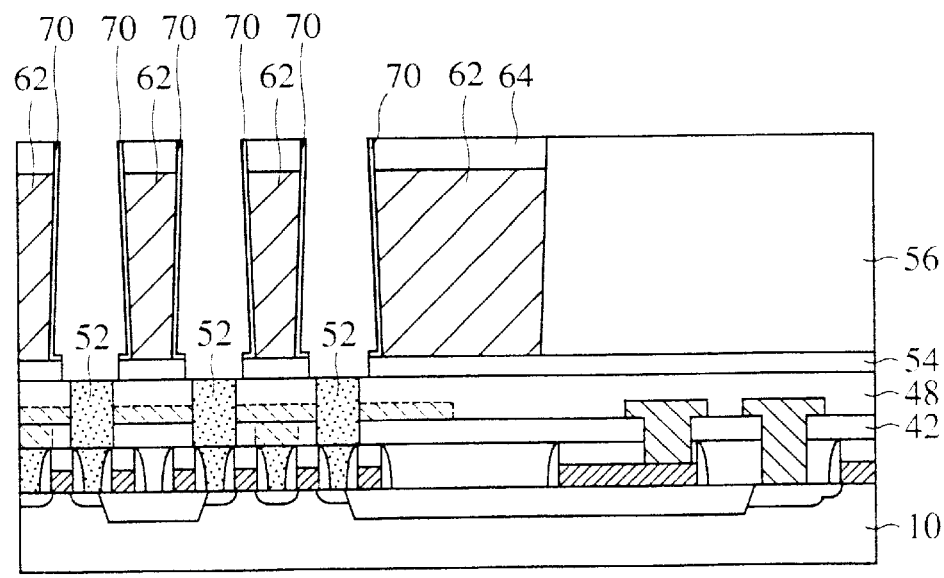

Then, the etching stopper film 54 exposed in the opening 68 is selectively removed by anisotropically etching, such as RIE or others to expose the plug 52 in the opening 68, (FIG. 7B). In this etching, the capacitor dielectric film 70 is exposed to the etching environments but is free from serious damages because the capacitor dielectric film 70 is arranged in parallel with the direction of movement of the ions. The capacitor dielectric film 70 is a little damaged by the ion application and charge up, but the damage can be removed by relatively low-temperature thermal processing of 400–500° C.

In the present embodiment, the plate electrode 62 has the side wall inversely tapered, whereby plasma damage incorporated in the capacitor dielectric film 70 can be reduced in comparison with that in the case that the plate electrode 62 has the side wall made vertical or forward tapered.

The plate electrode 62 has the side wall inversely tapered, whereby additionally advantageously an opening width of the etching stopper film 54 along the bit line can be smaller than an opening width of the opening 68 along the bit line. That is, the parasitic capacitance between the bit line 44 and the storage electrode 72 can be lowered.

At the same time that the etching stopper film 54 is etched, the silicon nitride film 64 on the plate electrode 62 is etched. However, the etching stopper film 54, a film thickness (about 20 nm) of which is sufficiently thinner than a film thickness (100–300 nm) of the silicon nitride film 64, can be removed, leaving the silicon nitride film 64.

Then, a 50–300 nm-thick Ru film is deposited on the entire surface by, e.g., CVD method, and the Ru film on the inter-layer insulation film 56 is selectively removed by CMP method or etching back to form in the opening 68 the capacitor electrode 72 of the Ru film electrically connected to the source/drain diffused layer 28 through the plug 52. A material of the storage electrode 72 is suitably selected in accordance with compatibility with the capacitor dielectric film 70, as in the case of the plate electrode.

Next, as required, the interconnection layer 74 is formed, connected to the plate electrode 62; the interconnection layer 76 is formed, connected to the interconnection layer 46; etc.

Thus, a DRAM comprising memory cells including one transistor and one capacitor can be fabricated.

When a semiconductor device having an about 0.2 $\mu$m-Φ contact area between the plug 52 and the storage electrode 72 was fabricated by the above-described fabrication process, a contact resistance was about 10 Ω/contact. On the other hand, when the contact structure was formed by the conventional semiconductor device fabrication process in which the storage electrode was formed in advance, a contact resistance was about 1 MΩ/contact. Thus, it is evident that the method for fabricating the semiconductor device according to the present invention is much superior.

As described above, according to the present embodiment, the capacitor dielectric film 70 is formed after the plate electrode 58 has been formed, and then the storage electrode 72 connected to the plug 52, whereby electric characteristics between the plug 52 and the storage electrode 72 are not deteriorated by the high-temperature thermal processing in the step of forming the capacitor dielectric film 70.

The inter-layer insulation film 56 is left as it is in the peripheral circuit region, whereby the formation of the capacitor does not impair the surface flatness. Accordingly, the surface can be easily planarized in comparison with the conventional method in which a thick insulation film is formed and then the surface is planarized. The problem of depth of focus can be mitigated, which facilitates micronized patterning. There is no problem of impairing interconnection reliability at a step.

A Second Embodiment

The semiconductor device and the method for fabricating the same according to a second embodiment of the present invention will be explained with reference to FIGS. 10, 11A–11C and 12A–12B. The same members of the present embodiment as those of the semiconductor device and the method for fabricating the same according to the first embodiment are represented by the same reference numbers not to repeat or to simplify their explanation.

Figure 10:
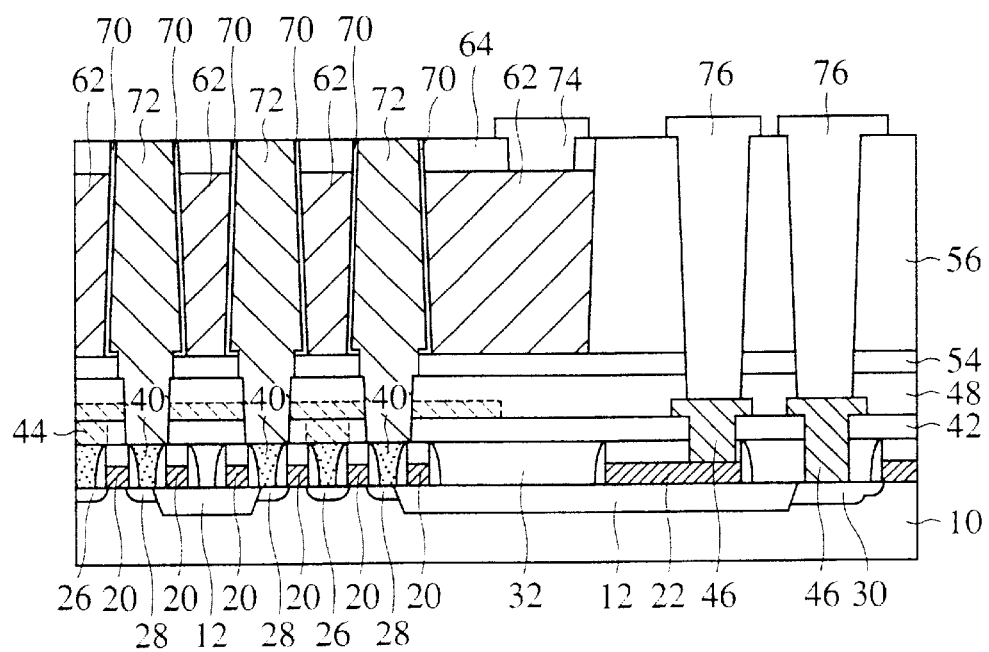
FIG. 10 is a diagrammatic sectional view of the semiconductor device according to a second embodiment of the present invention, which shows a structure thereof.

FIG. 10 is a diagrammatic sectional view of the semiconductor device according to the present embodiment, which show a structure thereof. FIGS. 11A–11C and 12A–12B are sectional views of the semiconductor device in the steps of the method for fabricating the semiconductor device, which show the method.

As shown in FIG. 10, the semiconductor device according to the present embodiment is basically the same as the semiconductor device according to the first embodiment shown in FIG. 3. The semiconductor device according to the present embodiment is characterized in that the storage electrode 72 is connected directly to the plug 40 without the plug 52 interposed therebetween. The semiconductor device has such structure, whereby a number of its fabrication steps can be small, and its fabrication cost can be low.

Next, the method for fabricating the semiconductor device according to the present embodiment will be explained with reference to FIGS. 11A–11C and 12A–12B.

First, in the same way as, e.g., in the method for fabricating the semiconductor device according to the first embodiment shown in FIGS. 4A to 4E, a memory cell transistor, a peripheral circuit transistor, a bit line 44, an interconnection layer 46, etc. are formed.

Figure 11A:
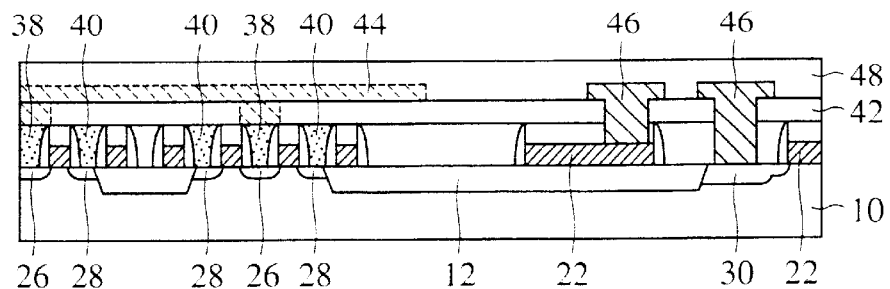
FIGS. 11A–11C and 12A–12B are sectional views of the semiconductor device according to the second embodiment of the present invention in the steps of the method for fabricating the same, which show the method.

Next, a silicon oxide film is deposited on the entire surface by, e.g., CVD method, and the surface of the silicon oxide film is polished by CMP method to form an inter-layer insulation film 48 of the silicon oxide film and having the surface planarized (FIG. 11A).

Figure 11B:
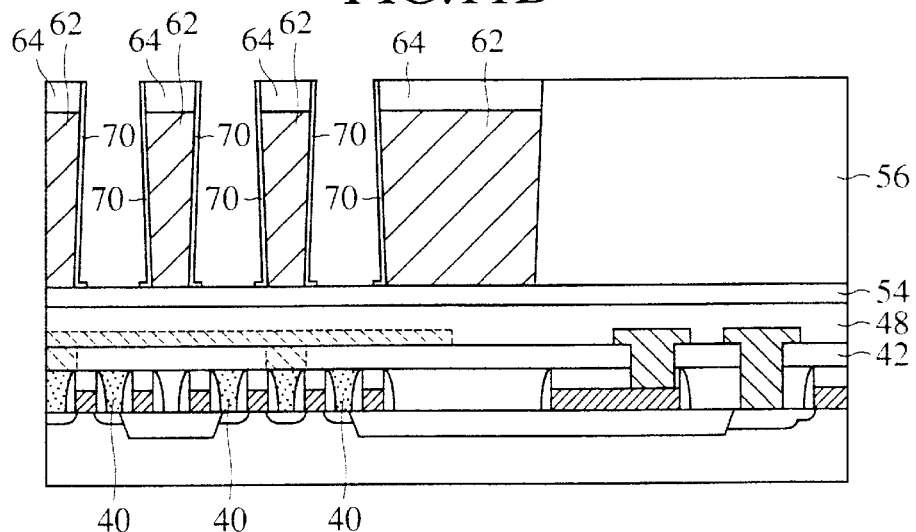

Then, in the same way as, e.g., in the method for fabricating the semiconductor device according to the first embodiment, an etching stopper film 54, an inter-layer insulation film 56, a plate electrode 62 and a capacitor dielectric film 70 are formed (FIG. 11B).

Next, thermal treatment is performed for sufficiently crystallizing a capacitor dielectric film 70 and supplementing oxygen defects in the film. At this time, a plug 40 is covered by an etching stopper film 54 of silicon nitride film known as an oxidation mask, etc., and the surface of the plug 40 is not oxidized. The storage electrode 72 has not yet been formed, and electrical characteristics between the plug 40 and the storage electrode 72 are not deteriorated.

Figure 11C:
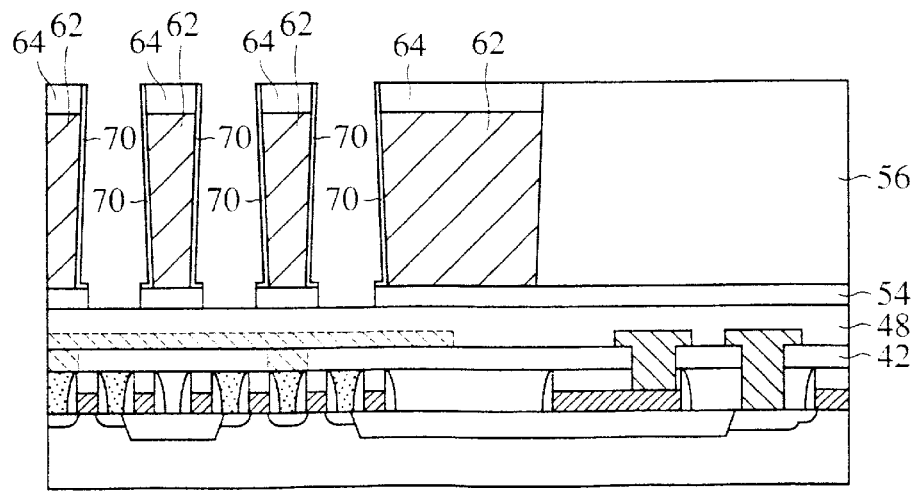

Then, the etching stopper film exposed in a opening 68 is selectively removed by anisotropically etching, such as RIE or others (FIG. 11C).

Figure 12A:
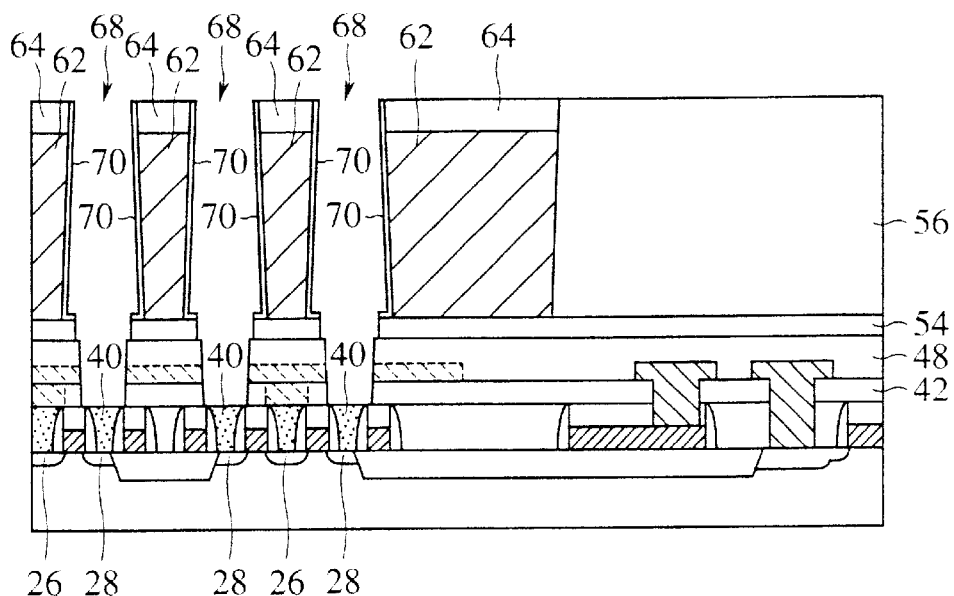

Then, the inter-layer insulation films 48, 42 exposed in the opening 68 are selectively removed by anisotropically etching such as RIE or others. Thus, the plug 40 connected to a source/drain diffused layer 28 is exposed in the opening 68 (FIG. 12A).

Here, the inter-layer insulation films 48, 42 can be etched by self-alignment with the silicon nitride film 47 formed on the bit line 44, and a sidewall insulation film of the silicon nitride film formed on the side wall of the bit line 44. Accordingly, the bit line 44 is not exposed in the opening 68.

The plate electrode 62 has the side wall inversely tapered, and a width of the opening formed in the inter-layer insulation films 48, 42 can be smaller than an opening width of the opening 68, whereby a parasitic capacitance between the bit line 44 and the storage electrode 72 can be small.

Figure 8A:
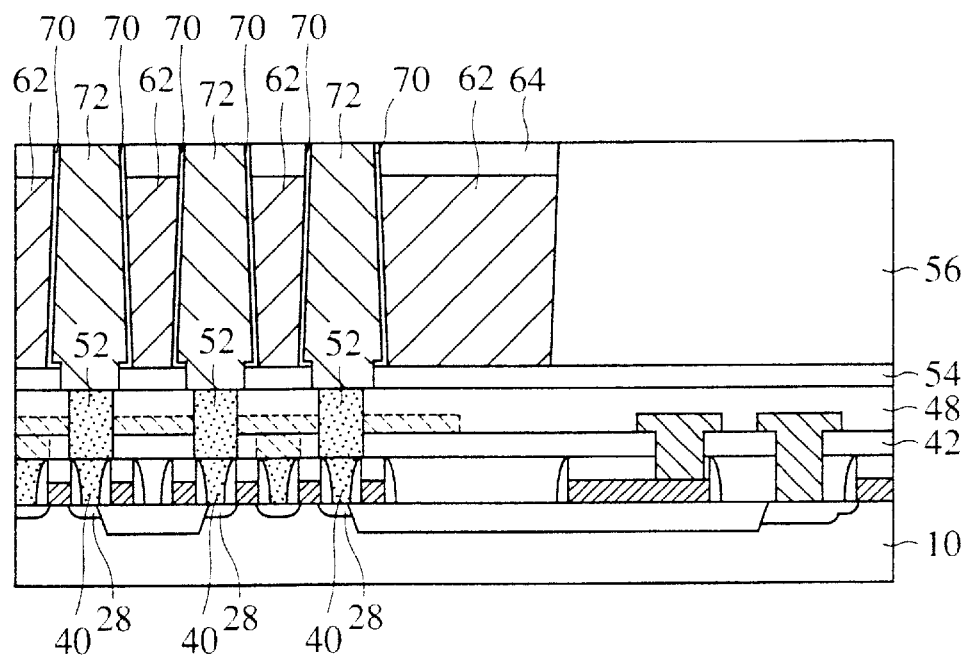
Figure 8B:
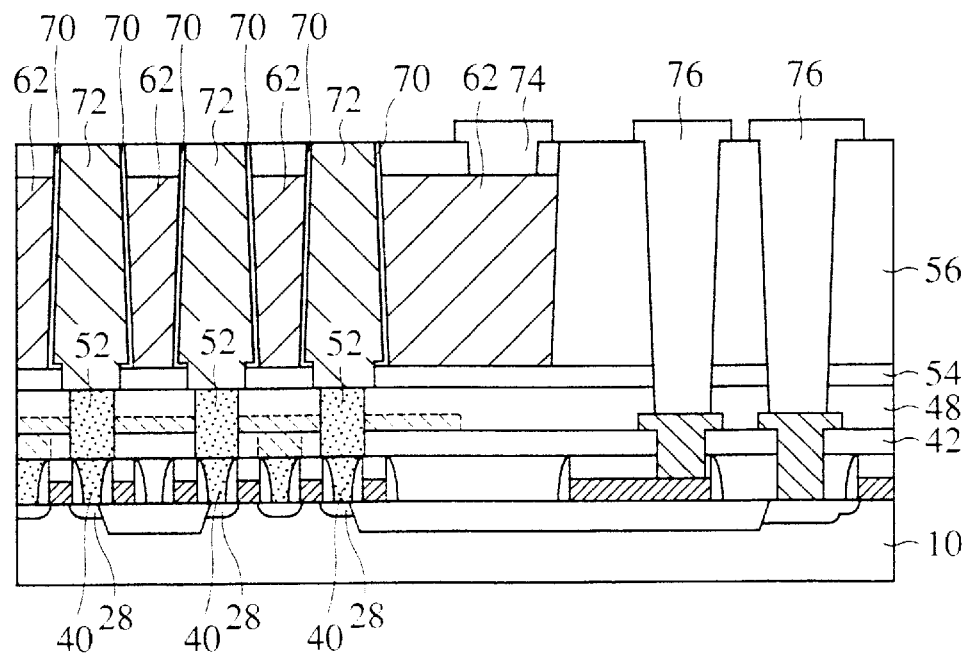
Figure 9:
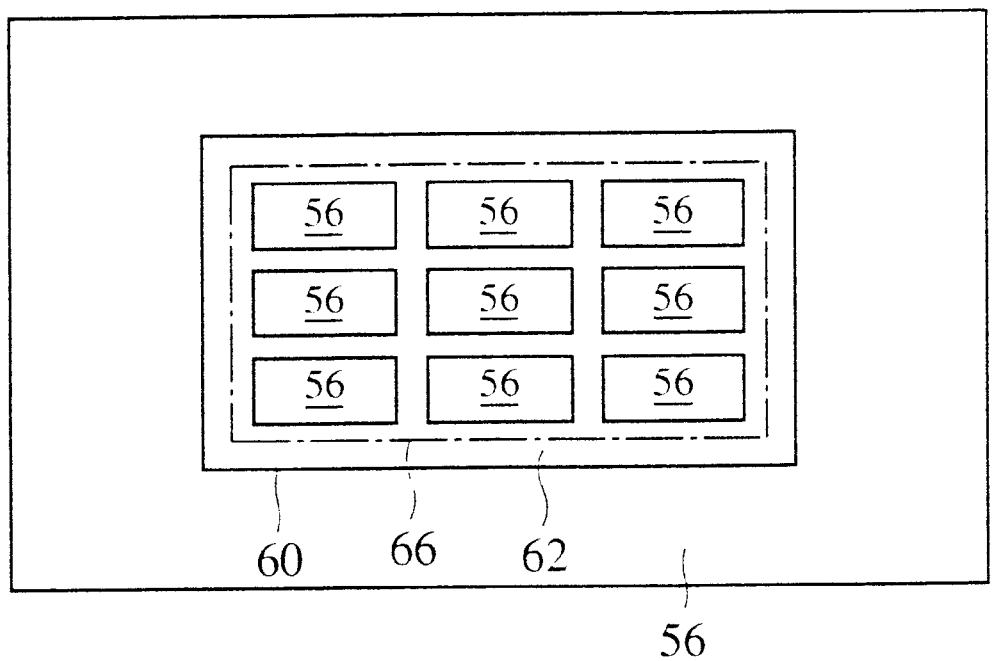
FIG. 9 is a view of one example of patterns of a photoresist film used in the method for fabricating the semiconductor device according to the first embodiment of the present invention.
Figure 12B:
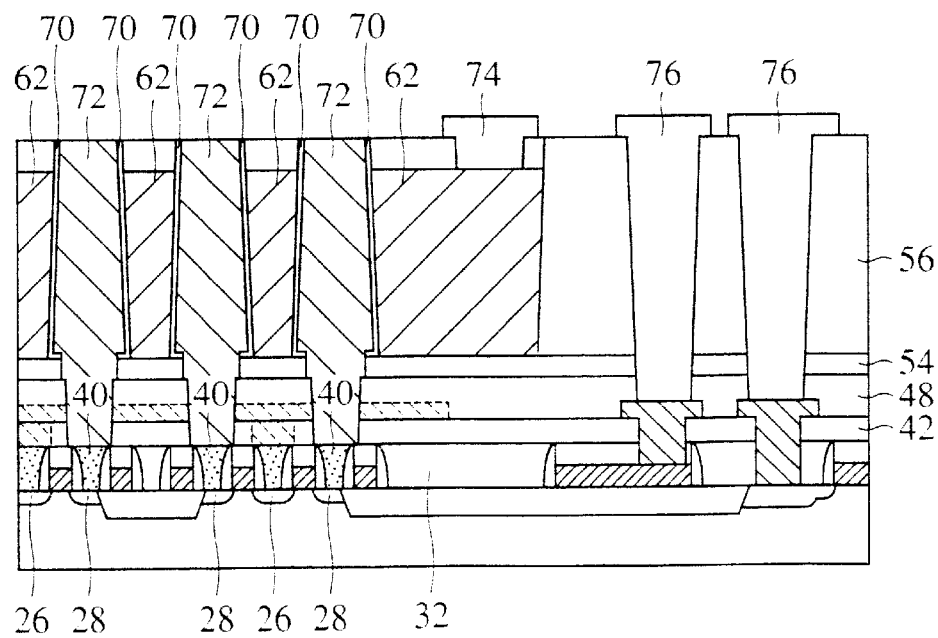

Next, in the same way as, e.g., in the method for fabricating the semiconductor device according to the first embodiment shown in FIGS. 8A and 8B, the storage electrode 72 and the interconnection layers 74 are formed. Thus, a DRAM comprising memory cells each including one transistor and one capacitor can be fabricated (FIG. 12B).

As described above, according to the present embodiment, also in forming the storage electrode 72 so as to function also as the plug 52 of the first embodiment, deterioration of electric characteristics between the plug 40 and the storage electrode 72 by the high-temperature thermal processing in forming the capacitor dielectric film 70 can be prevented.

In the present embodiment, the storage electrode 72 is connected to the source/drain diffused layer 28 through the plug 40. However, the storage electrode 72 may be connected directly to the source/drain diffused layer 28, and in this case, the present invention is significant in that oxidation of the surface of the silicon substrate 10, and aggregation of a silicide layer formed between the storage electrode 72 and the silicon substrate 10 are suppressed in the high-temperature thermal processing for forming the capacitor dielectric film 70. The storage electrode 72 is connected directly to the silicon substrate 10 by further etching the inter-layer insulation film 32 below the inter-layer insulation film 42 in the step of FIG. 12A.

In the semiconductor device according to the present embodiment, the plug 40 of doped polycrystalline silicon and the storage electrode 72 of the metal directly contact each other, and there is a risk that the plug 40 and the storage electrode 72 may react with each other in a later thermal processing to form an eutectic alloy. Accordingly, it is also preferable to form in advance on the upper surface of the plug 40 a barrier metal for preventing the eutectic reaction, and in this case, the barrier metal of, e.g., TiN/Ti may be formed on the upper surface of the plug 40 immediately after the plug 40 has been formed.

The barrier metal may be formed thin by sputtering after the step of FIG. 12A. In this case, sputtered particles are not easily deposited on the side wall of the opening 68, which is inversely tapered, and can be deposited selectively on the plug 40. This method is effective when the barrier metal and the capacitor dielectric film 70 have poor compatibility with each other.

The barrier metal of TiON film may be formed on the entire surface by CVD method. This is effective in a case that the capacitor dielectric film 70 is formed of $Ti_2O_5$ film because TiON film has good compatibility with $Ti_2O_5$ film.

A Third Embodiment

The semiconductor device according to a third embodiment of the present invention and the method for fabricating the semiconductor device will be explained with reference to FIGS. 13, 14A–14B, 15A–15B, 16A–16B, 17A–17B, and 18. The same members of the present embodiment as those of the semiconductor device and the method for fabricating the same according to the first and the second embodiments are represented by the same reference numbers not to repeat or to simplify their explanation.

Figure 13:
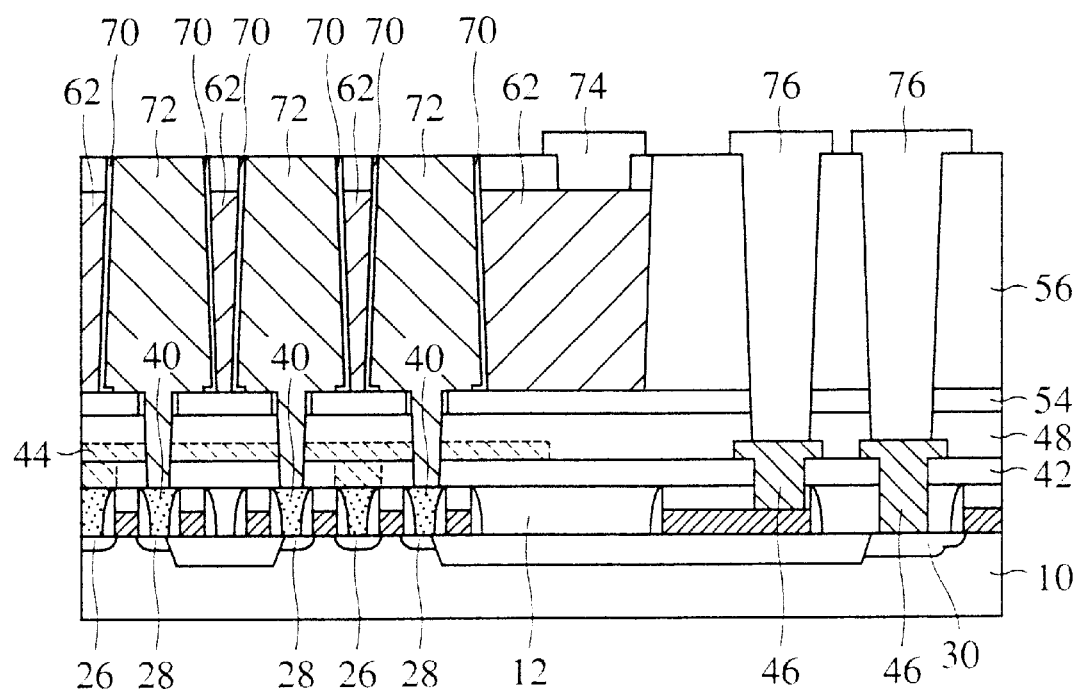
FIG. 13 is a diagrammatic sectional view of the semiconductor device according to a third embodiment of the present invention, which shows a structure thereof.

FIG. 13 is a diagrammatic sectional view of the semiconductor device according to the third embodiment of the present invention, which shows the structure thereof. FIGS. 14A–14B, 15A–15B, 16A–16B, and 17A–17B are sectional views of the semiconductor device according to the present embodiment in the steps of the method for fabricating the same, which show the method. FIG. 18 is a view of an example of patterns of the photoresist film used in the method for fabricating the semiconductor device according to the present embodiment.

As shown in FIG. 13, the semiconductor device according to the present embodiment is basically the same as the semiconductor device according to the second embodiment. The semiconductor device according to the present embodiment is characterized in that a width of the contact part of a storage electrode 72 is smaller than an opening width of an opening 68 with the storage electrode 72 buried in. A width of the contact part of the storage electrode 72 along the extension of a bit line 44 is reduced, whereby a parasitic capacitance between the bit line 44 and the storage electrode 72 can be small, and a storage capacitance required by the capacitor can be accordingly small. Accordingly, a merit is that the storage electrode 72 can have a height reduced. The storage electrode 72 can be low, which facilitates the process of forming an opening in an inter-layer insulation film 56.

Next, the method for fabricating the semiconductor device according to the present embodiment will be explained with reference to FIGS. 14A–14B, 15A–15B, 16A–16B, and 17A–17B.

Figure 14A:
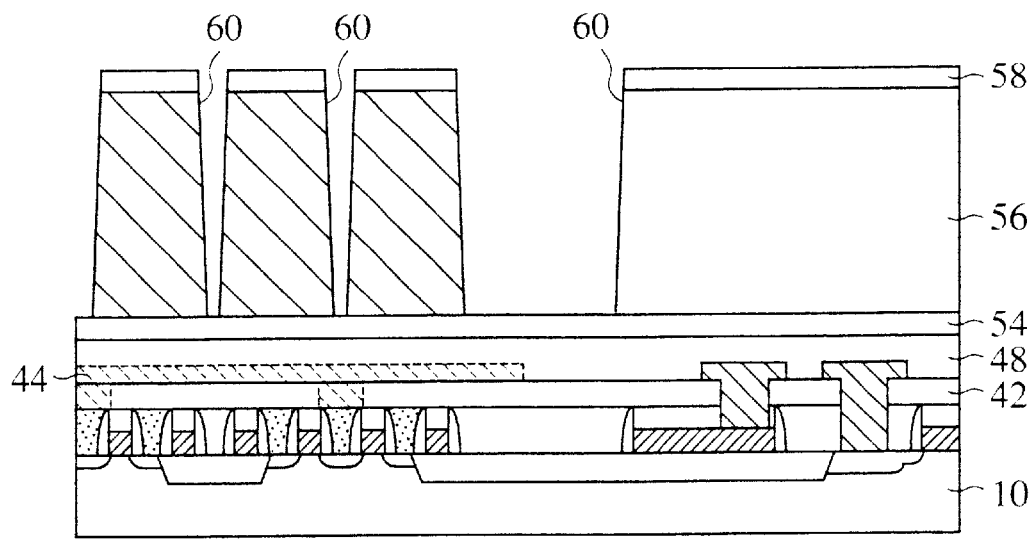
FIGS. 14A–14B, 15A–15B, 16A–16B, and 17A–17B are sectional views of the semiconductor device according to the third embodiment of the present invention in the steps of the method for fabricating the same, which show the method.

First, in the same way as, e.g., in the method for fabricating the semiconductor device according to the first embodiment shown in FIGS. 4A to 4E and FIG. 5C, a memory cell transistor, a peripheral circuit transistor, a bit line 44, an interconnection layer 46, an etching stopper film 54, an inter-layer insulation film 56, a mask film 58, an opening 60, etc. are formed. The plug 52 is not formed, as is not in the second embodiment (FIG. 14A)

Figure 14B:
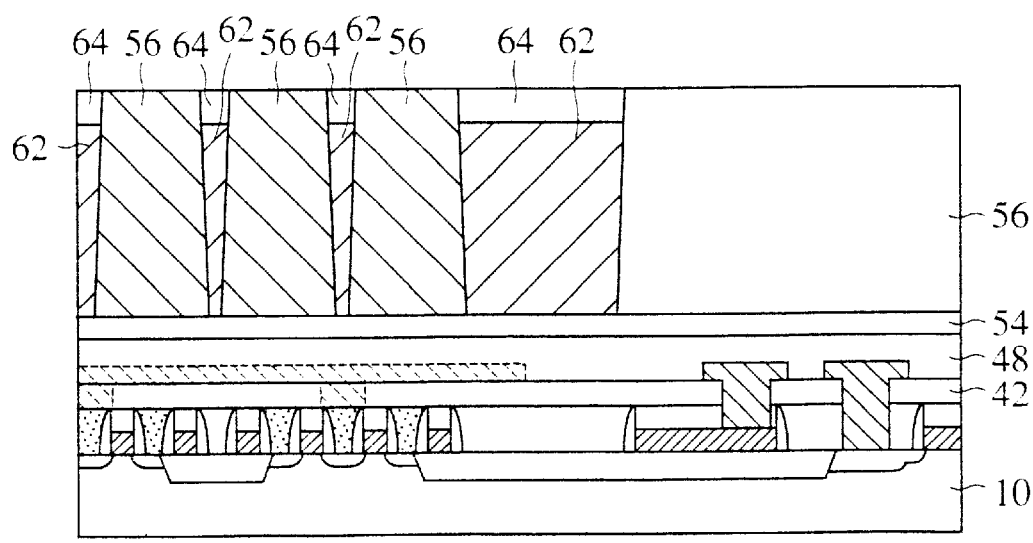

Then, in the same way as in, e.g., the method for fabricating the semiconductor device according to the first embodiment shown in FIGS. 6A and 6B, a plate electrode 62 buried in the opening 60, and a silicon nitride film 64 covering the upper surface of the plate electrode 62 are formed (FIG. 14B)

Figure 15A:
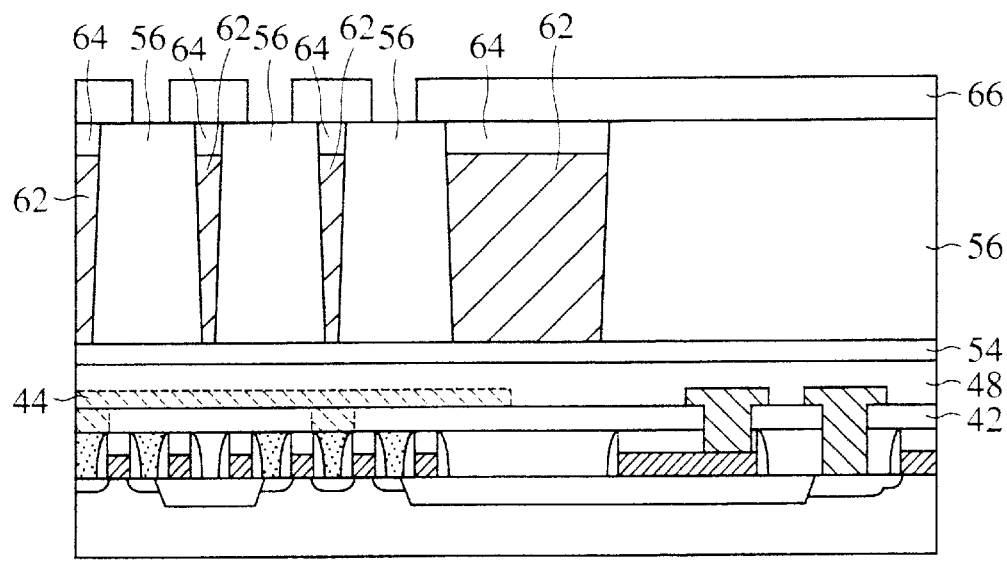

Next, a photoresist film 66 is formed on the inter-layer insulation film 56 and the silicon nitride film 64 by the lithography (FIG. 15A).

The photoresist film 66 has the pattern exemplified in FIG. 18. The photoresist film 66 has a pattern which exposes at least a part of the inter-layer insulation film 56 in a memory cell region and has a width of an opening along extension of the bit line 44 is sufficiently smaller than a width of the inter-layer insulation film 56. For parasitic capacitance reduction it is preferable that an opening width along extension of the bit line is about ⅓ of a width of the storage electrode along extension of the storage electrode 72. A pattern for forming such opening can be a stripe pattern in which, as exemplified in FIG. 18, narrow stripes are extended perpendicularly to the direction of extension of the bit line 44.

Figure 15B:
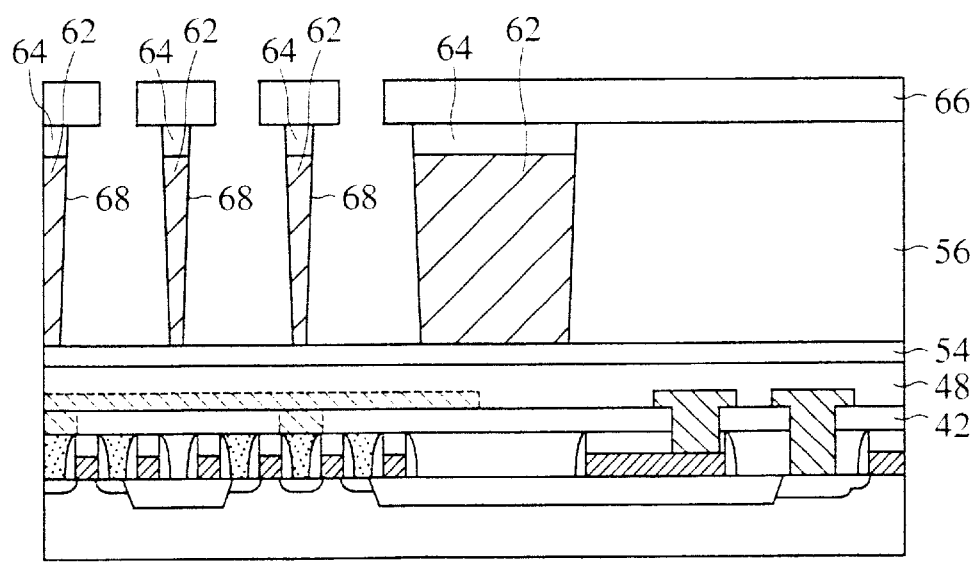

Then, the inter-layer insulation film 56 is selectively etched with the photoresist film 66 as a mask selectively with respect to the plate electrode 62, the silicon nitride film 64 and the etching stopper film 54 to form the opening 68 (FIG. 15B). At this time, the inter-layer insulation film 56 is etched under conditions for wet etching using an HF-based aqueous solution or others, which isotropically advance the etching to be thereby selectively removed.

Figure 16A:
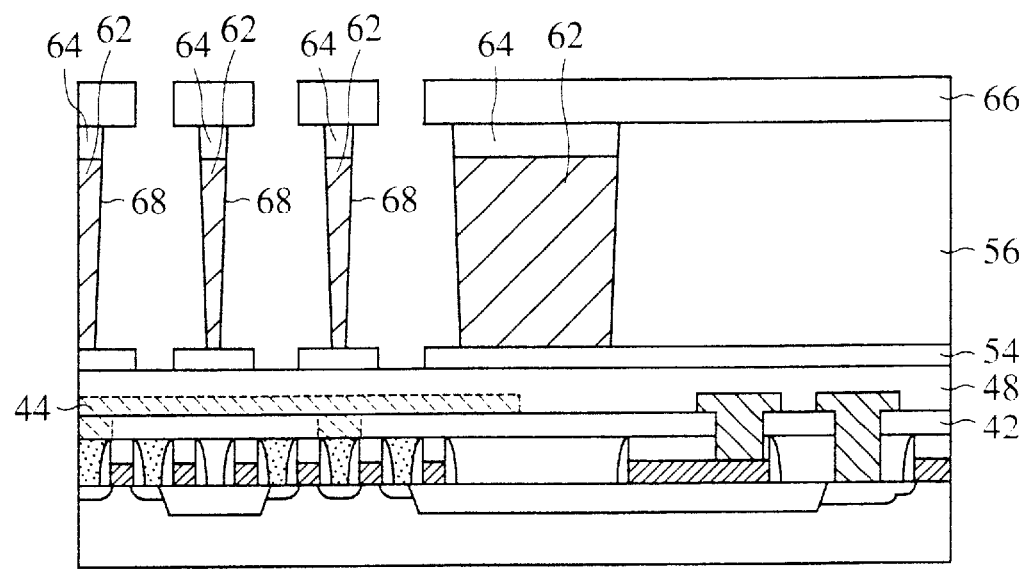

Next, with the photoresist film 66 as a mask, the etching stopper film 54 exposed in the opening 68 is selectively removed by anisotropically etching, such as RIE or others (FIG. 16A). The etching stopper film 54 is etched with the photoresist film 66 as a mask, whereby an open width of the etching-stopper film 54 along extension of the bit line 44 can be made substantially equal to an open width of the photoresist film 66. The etching stopper film 54 can be selectively removed by, e.g., anisotropic etching using $CF_4$ gas and $C_2H_4$ gas.

Then, after the photoresist film 66 has been removed, a 10–30 nm-thick $Ta_2O_5$ film or BST film is deposited on the entire surface by, e.g., CVD method to form the capacitor dielectric film 70 of $Ta_2O_5$ or BST.

Figure 16B:
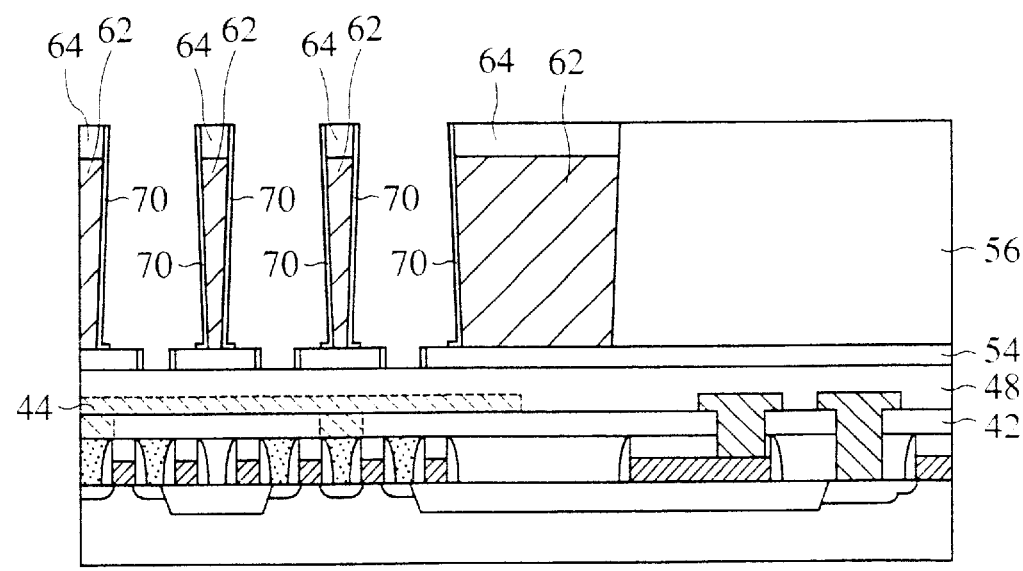

Next, the capacitor dielectric film 70 is anisotropically etched to be left selectively on the side wall of the opening 68 (FIG. 16B).

Next, thermal treatment follows for sufficiently crystallizing the capacitor dielectric film 70 and supplementing oxygen defects of the film. At this time, the plug 40, which is not exposed, is not oxidized by the thermal treatment, or contact characteristics of the plug 40 with the storage electrode 72, which is to be formed in a later step are not deteriorated.

Figure 17A:
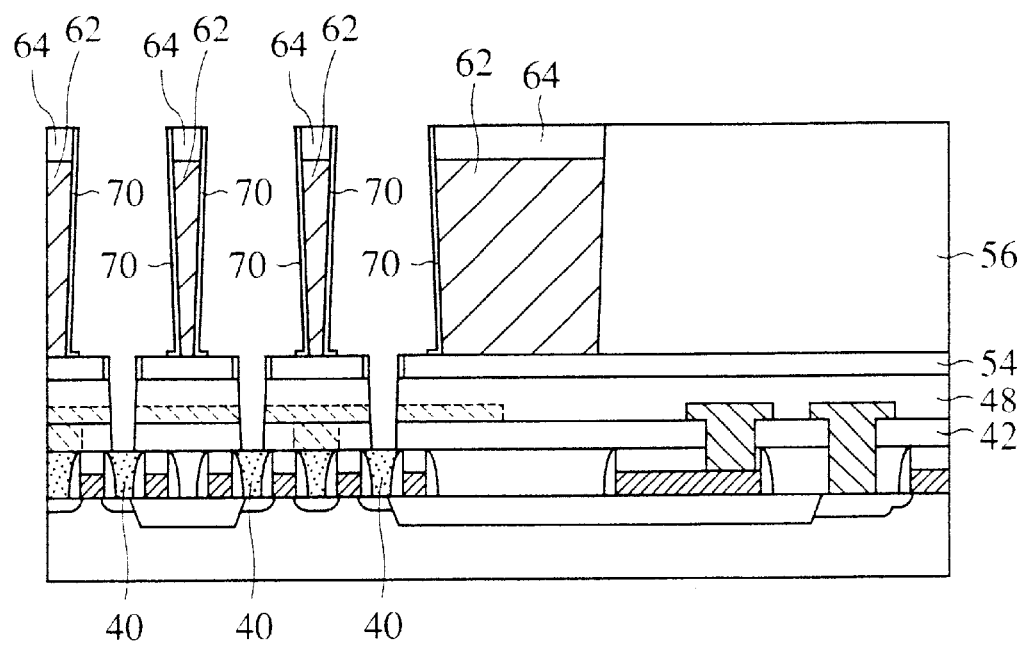
Figure 18:
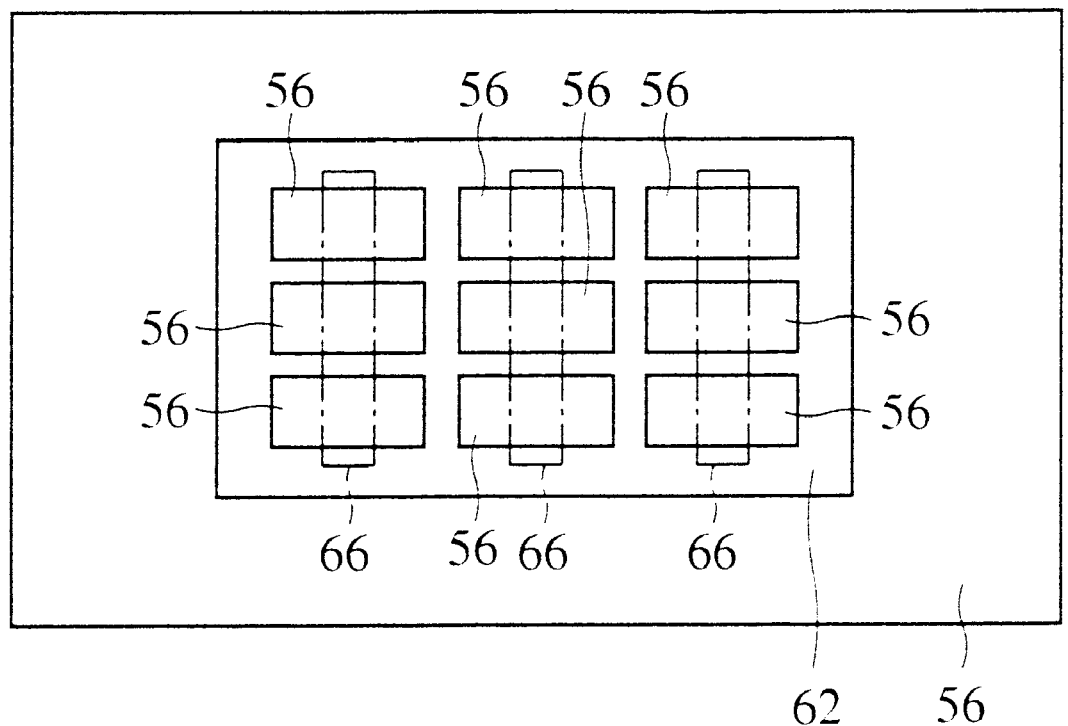
FIG. 18 is a view of one example of patterns of the photoresist film used in the method for fabricating the semiconductor device according to the third embodiment of the present invention.

Next, with the silicon nitride film 64 and the etching stopper film 54 as a mask, the inter-layer insulation films 48, 42 are selectively removed by anisotropically etching, such as RIE or others to expose the plug 40 in the opening 68 (FIG. 17A). The inter-layer insulation films 48, 42 are etched with the etching stopper film 54 as a mask, whereby an open width of the inter-layer insulation films 48, 42 along extension of the bit line 44 can be made substantially equal to an open width of the photoresist film 66.

Then, in the same way as, e.g., in the method for fabricating the semiconductor device according to the first embodiment shown in FIGS. 8A and 8B, the storage electrode 72, an interconnection layers 74, 76 are formed. Thus, a DRAM comprising memory cells including one transistor and one capacitor is fabricated.

As described above, according to the present embodiment, a width of the contact part of the storage electrode 72 along extension of the bit line 44 can be decreased, whereby a parasitic capacitance between the bit line 44 and the storage electrode 72 can be much small.

A Fourth Embodiment

The semiconductor device and the method for fabricating the same according to a fourth embodiment of the present invention will be explained with reference to FIGS. 19, 20A–20B, and 21A–21B. The same members of the present embodiment as those of the semiconductor device and the method for fabricating the same according to the first to the third embodiments are represented by the same reference numbers not to repeat or to simplify their explanation.

Figure 19:
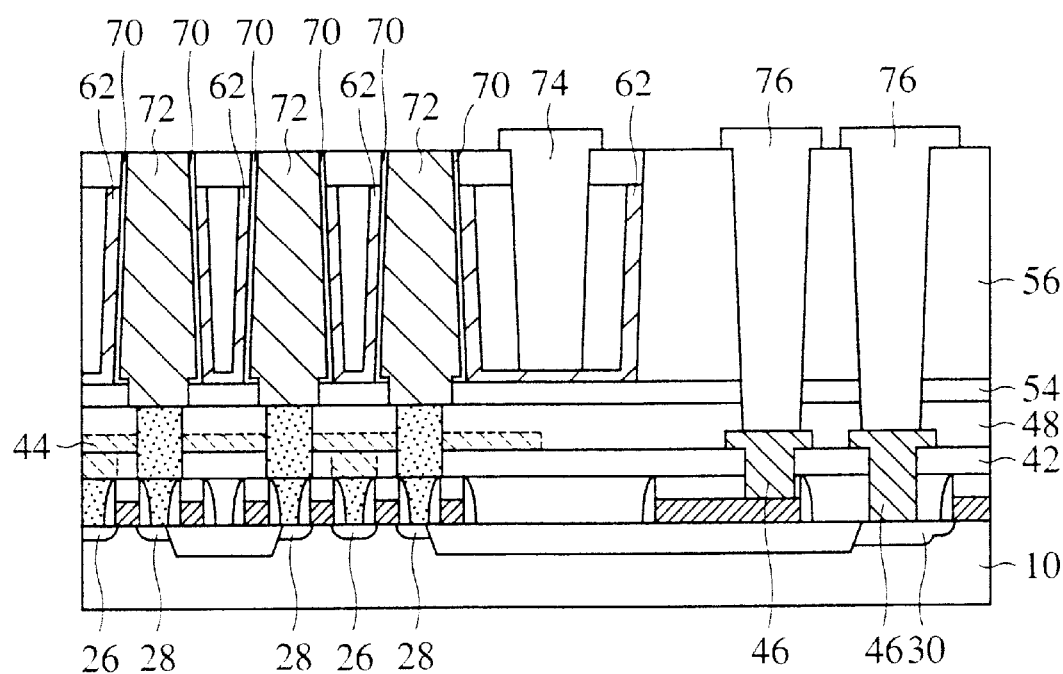
FIG. 19 is a diagrammatic sectional view of the semiconductor device according to a fourth embodiment of the present invention, which shows a structure thereof.

FIG. 19 is a diagrammatic sectional view of the semiconductor device according to the present embodiment. FIGS. 20A–20B and 21A–21B are sectional views of the semiconductor device according to the present embodiment in the steps of the method for fabricating the semiconductor device, which show the method.

As shown in FIG. 19, the semiconductor device according to the present embodiment is basically the same as the semiconductor device according to the first embodiment shown in FIG. 3. The semiconductor device according to the present embodiment is characterized in that a plate electrode 62 is not buried between storage electrodes 72, but a thin plate electrode 62 is formed along the storage electrodes and the etching stopper film 54.

Next, the method for fabricating the semiconductor device according to the present embodiment will be explained with reference to FIGS. 20A–20B and 21A–21B.

Figure 20A:
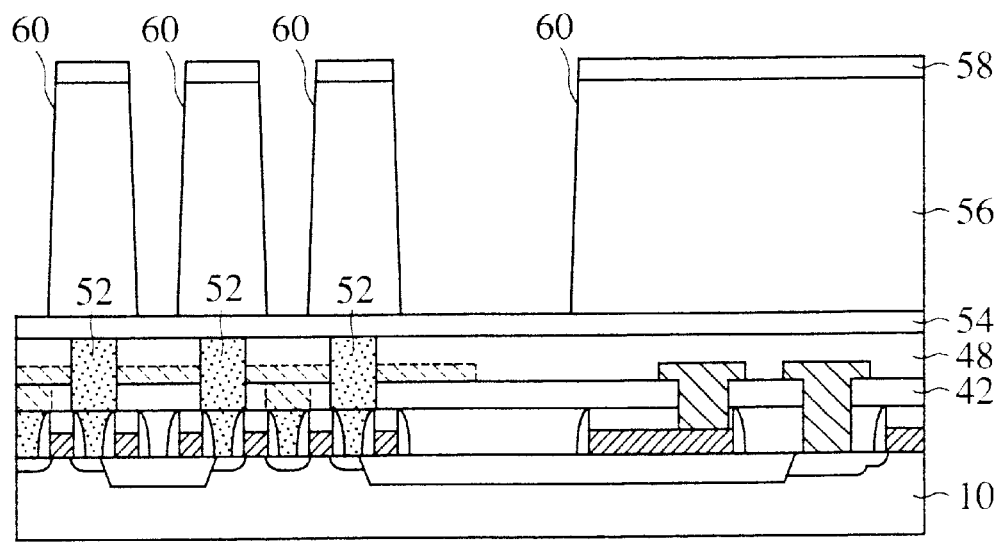
FIGS. 20A–20B and 21A–21B are sectional views of the semiconductor device according to the fourth embodiment of the present invention in the steps of the method for fabricating the same, which show the method.

First, in the same way as, e.g., in the method for fabricating the semiconductor device according to the first embodiment, a memory cell transistor, a peripheral circuit transistor, a bit line 44, an interconnection layer 46, an etching stopper film 54, an inter-layer insulation film 56, a mask film 58, an opening 60 are formed (FIG. 20A).

Next, a photoresist film (not shown) used in forming the opening 60 is removed by, e.g., plasma ashing, and the mask film 58 of amorphous silicon film is removed by, e.g., dry etching.

Figure 20B:
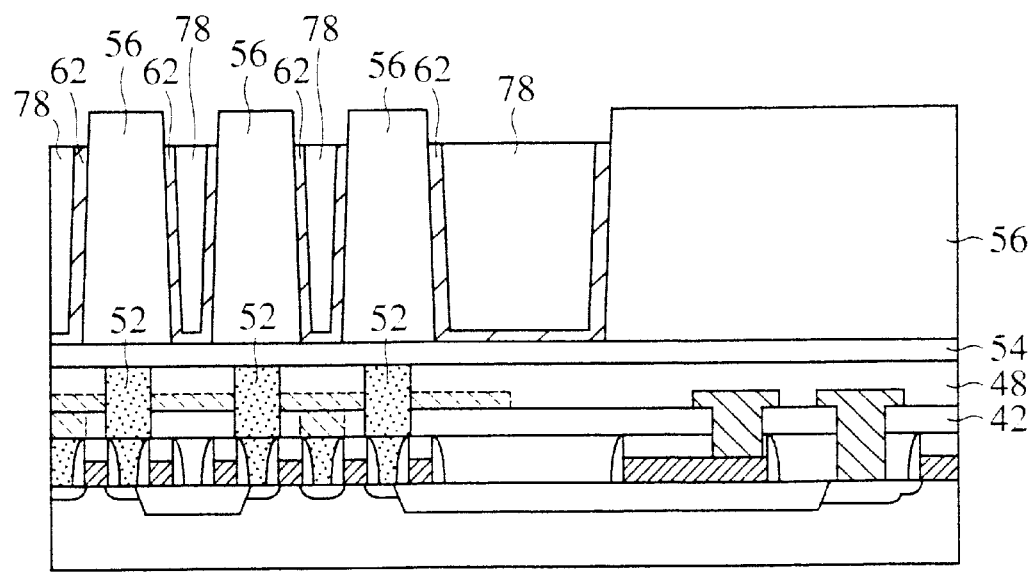

Then, a 10–50 nm-thick conducting film and a 100–300 nm-thick insulation film are deposited on the entire surface by, e.g., CVD method, and the conducting film and the insulation film on the inter-layer insulation film 56 are selectively removed by CMP method or etching back to form the plate electrode 62 of the conducting film formed along the inside wall and the bottom of the opening 60, and an insulation film 78 of the insulation film buried in the opening 60 with the plate electrode 62 formed in. At this time, over-etching is performed until the surfaces of the plate electrode 62 and the insulation film 78 are lower about 100–300 nm than the surface of the inter-layer insulation film 56 (FIG. 20B).

Figure 21A:
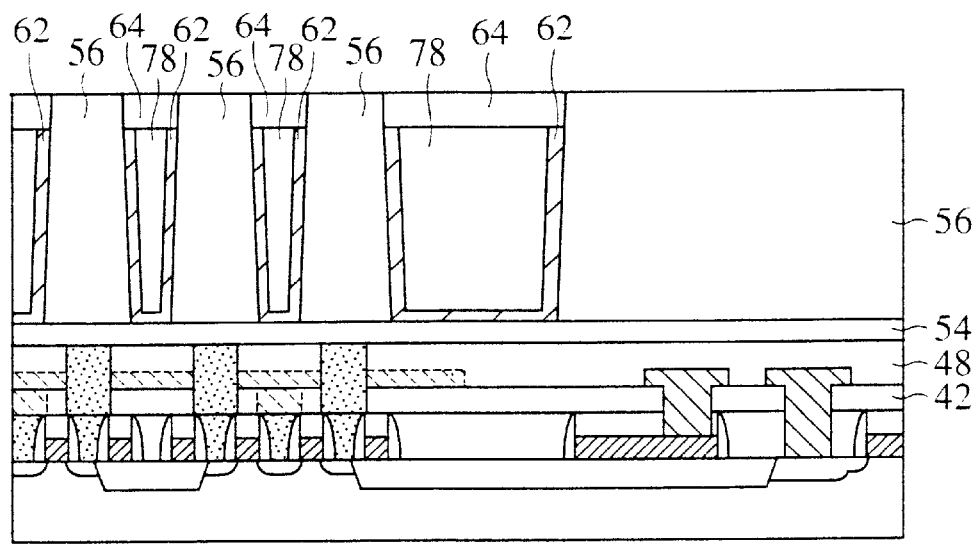

Then, a 200–500 nm-thick silicon nitride film is deposited on the entire surface by, e.g., CVD method, and the silicon nitride film on the inter-layer insulation film 56 is selectively removed by CMP or etching-back to be buried in the opening 60 on the plate electrode 62 and the insulation film 78 (FIG. 21A).

Figure 21B:
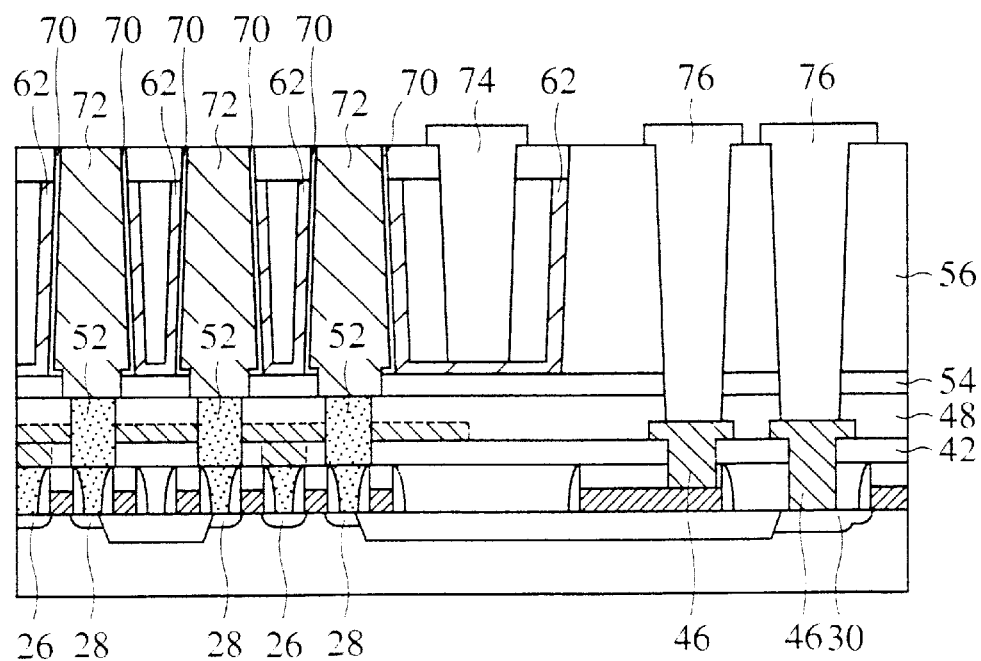

Next, in the same way as, e.g., in the method for fabricating the semiconductor device according to the first embodiment shown in FIGS. 7A to 8B, a capacitor dielectric film 70, the storage electrode 72, interconnection layers 74, 76, etc. are formed. As shown in FIG. 21B, the interconnection layer 74 can be connected to the plate electrode 62 at the bottom of the opening 60.

Thus, a DRAM comprising memory cell each including one transistor and one capacitor is fabricated.

As described above, according to the present embodiment, in place of burying the plate electrode 62 completely between the storage electrodes 72, the plate electrode 62 can be formed thin along the storage electrode 72 and the etching stopper film 54.

The method for fabricating the semiconductor device according to the present embodiment has a merit that plasma damage to the capacitor can be decreased when the process for simultaneously forming the contact hole for connecting the interconnection layer 76 of the peripheral circuit to the interconnection layer 46 and the contact hole for connecting the interconnection layer 74 to the plate electrode is considered. That is, the plate electrode 62 and the interconnection layer 74 are contacted each other near the bottom of the opening 60, whereby a depth difference between the peripheral circuit contact hole and the contact hole for connecting the plate electrode 62 can be small. Accordingly, a period time in which the capacitor is exposed to plasm damage due to charge-up, etc. until the peripheral circuit contact hole is opened after the contact hole for connecting the plate electrode 62 has been completely opened can be shortened. Thus, the method for fabricating the semiconductor device according to the present embodiment is very effective from the viewpoint of ensuring reliability of the capacitor.

In the present embodiment, the plate electrode 62 is formed along the inside wall of the opening 60, but the storage electrode 72 may be also formed along the inside wall of the opening 68.

In the present embodiment, the plate electrode 62 is formed along the inside wall of the opening 60 of the semiconductor device according to the first embodiment. This may be also applicable to the semiconductor device according to the second and the third embodiments.

A Fifth Embodiment

The semiconductor device and the method for fabricating the same according to a fifth embodiment of the present invention will be explained with reference to FIGS. 22, 23A–23B, 24A–24B, and 25A–25B. The same members of the present embodiment as those of the semiconductor device and the method for fabricating the same according to the first to the fourth embodiments are represented by the same reference numbers not to repeat or to simplify their explanation.

Figure 22:
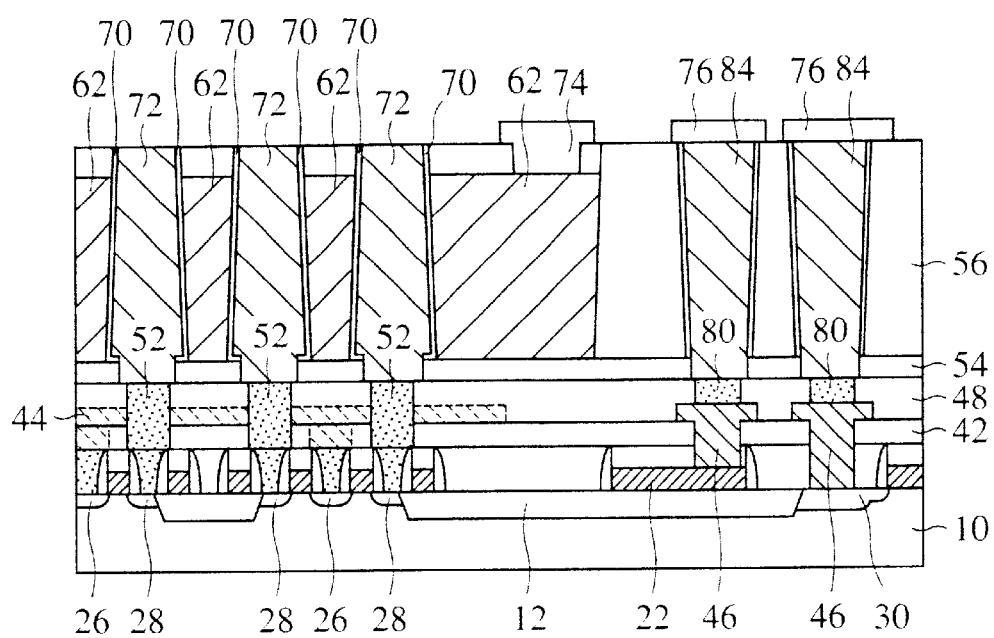
FIG. 22 is a diagrammatic sectional view of the semiconductor device according to a fifth embodiment of the present invention, which shows a structure thereof.

FIG. 22 is a diagrammatic sectional view of the semiconductor device according to the present embodiment. FIGS. 23A–23B, 24A–24B, and 25A–25B are sectional views of the semiconductor device according to the present embodiment in the steps of the method for fabricating the same, which show the method.

As shown in FIG. 22, the semiconductor device according to the present embodiment is characterized in that an interconnection layer 76 of a peripheral circuit region is connected to an interconnection layer 46 through a plug 84 of the same conducting layer as a storage electrode 72. This structure of the semiconductor device makes it unnecessary to form a contact hole deep for connecting the peripheral circuit interconnection layer 76 to the interconnection layer 46, without adding to a fabrication step number. When the semiconductor device according to the first embodiment uses the structure of burying the plug in the contact hole, the method for fabricating the semiconductor device additionally requires the step of burying a conducting film to be the plug. However, the present embodiment can delete this step.

Next, the method for fabricating the semiconductor device according to the present embodiment will be explained with reference to FIGS. 23A–23B, 24A–24B, and 25A–25B.

Figure 23A:
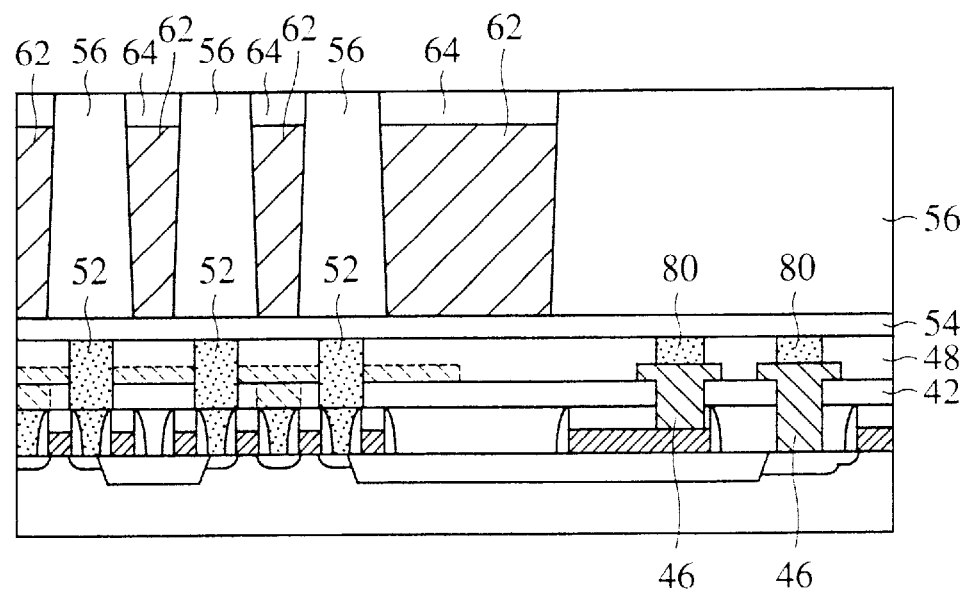
FIGS. 23A–23B, 24A–24B, and 25A–25B are sectional views of the semiconductor device according to the fifth embodiment of the present invention in the steps of the method for fabricating the same, which show the method.

In the same way as, e.g., in the method for fabricating the semiconductor device according to the first embodiment, a memory cell transistor, a peripheral circuit transistor, a bit line 44, an interconnection layer 46, a plate electrode 62, etc. are formed. At this time, in the steps of FIGS. 5A and 5B, a plug 52 connected to a plug 40, and a plug 80 connected to the interconnection layer 46 are simultaneously formed (FIG. 23A).

Next, a photoresist film 66 having an opening as exemplified in FIG. 9 formed in the memory cell region and an opening formed in a region where the contact hole of the peripheral circuit region is to be formed is formed by the lithography.

Figure 23B:
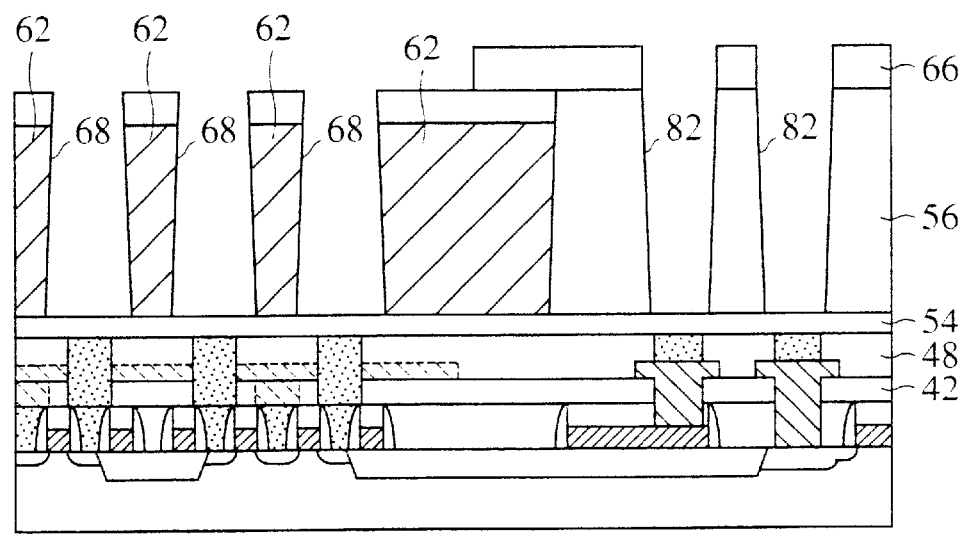

Then, with the photoresist film 66 and the silicon nitride film 64 as a mask and with the etching stopper film 54 as a stopper, the inter-layer insulation film 56 is anisotropically etched to form the opening 68 in the memory cell region and the contact hole 82 in the peripheral circuit region (FIG. 23B).

In the present embodiment, in which the opening 68 and the contact hole 82 are simultaneously formed, it is difficult to use the isotropically wet etching for etching the inter-layer insulation film 56 as used in the method for fabricating the semiconductor device according to the first embodiment. On the other hand, when the inter-layer insulation film 56 is anisotropically etched, there is a risk that unnecessary insulation film may remain on the side wall of the plate electrode 62 because the side wall of the opening 68 contours an inversely tapered shape of the plate electrode 62, and, in this case, the anisotropically etching is followed by a little isotropically etching to thereby remove the unnecessary insulation film.

Then, after the photoresist film 66 is removed, a 10–30 nm-thick $Ta_2O_5$ film or BST is deposited on the entire surface by, e.g., CVD method to form the capacitor dielectric film 70 of $Ta_2O_5$ or BST.

Figure 24A:
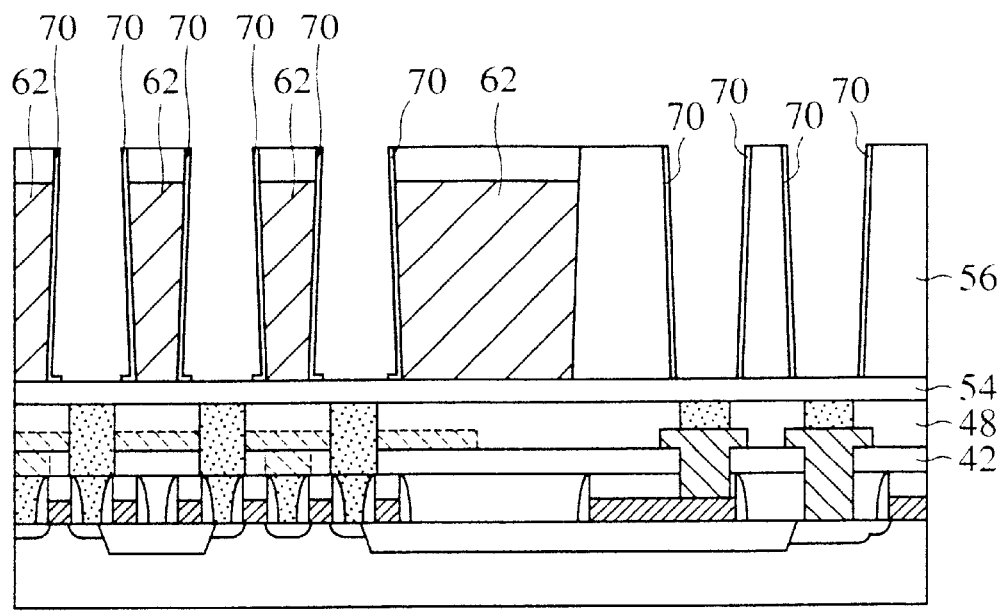

Then, the capacitor dielectric film 70 is anisotropically etched to be left selectively on the side walls of the opening 68 and the contact hole 82 (FIG. 24A).

Next, thermal treatment is performed by sufficiently crystallizing the capacitor dielectric film 70 and supplementing oxygen defects of the capacitor dielectric film 70. At this time, the plug 52 is covered by the etching stopper film 54 of silicon nitride film, which is known as an oxidation mask, and the surface is not oxidized. The storage electrode 72 has not been formed yet, and electric characteristics between the plug 52 and the storage electrode 72 are not deteriorated.

Figure 24B:
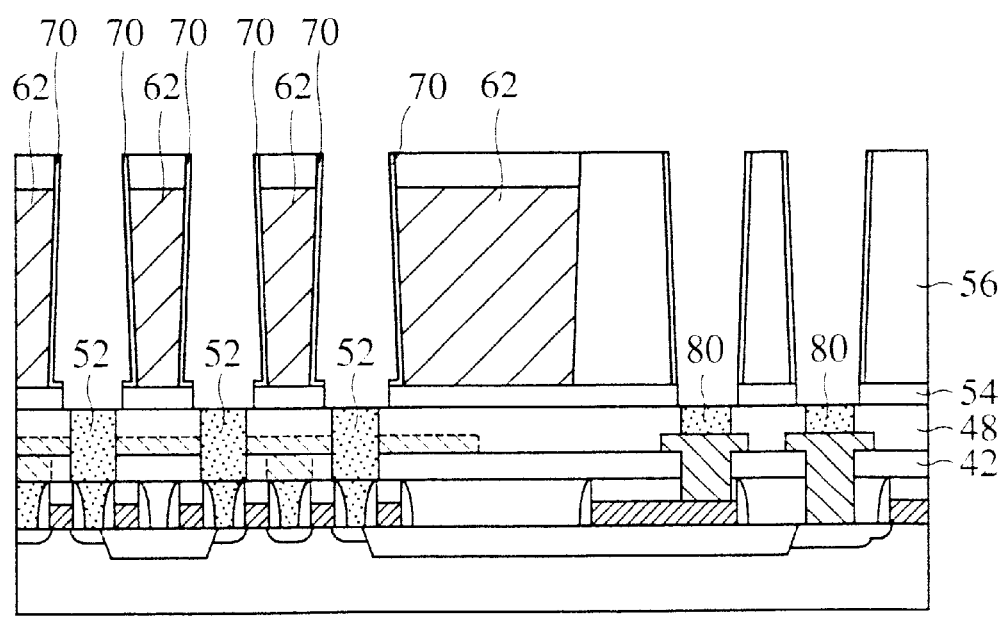

Then, the etching stopper film 54 exposed in the opening 68 is selectively removed by anisotropically etching, such as RIE or others to expose the plug 52 in the opening 68 and the plug 80 in the contact hole 82 (FIG. 24B).

Figure 25A:
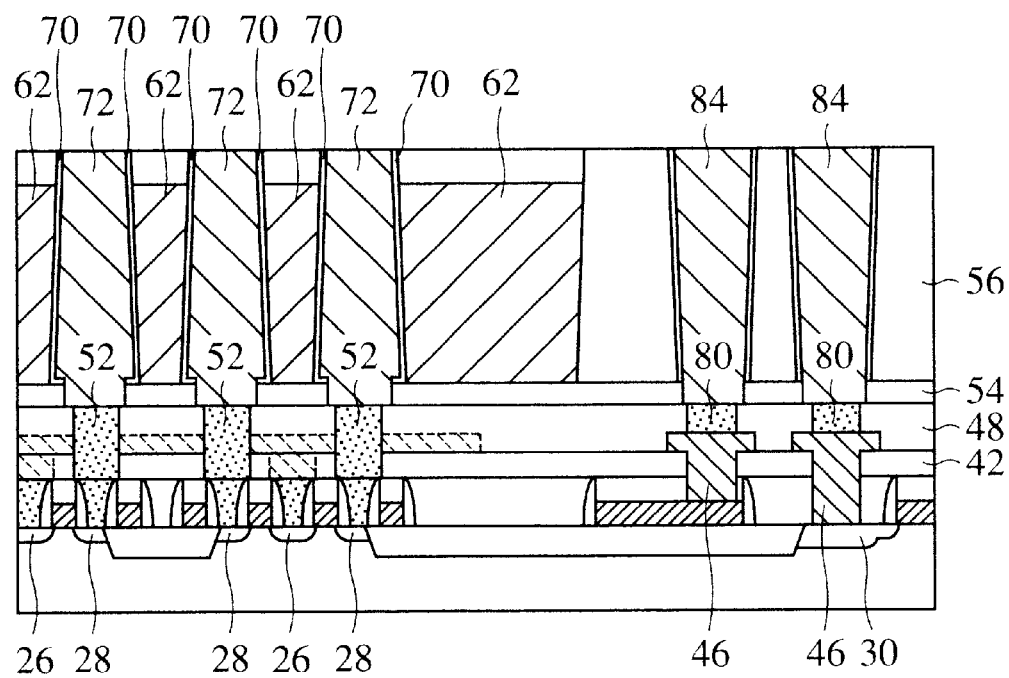

Next, a 50–300 nm-thick Ru film is deposited on the entire surface by, e.g., CVD method, and the Ru film on the inter-layer insulation film 56 is selectively removed by CMP method or etching back to form the storage electrode 72 of the Ru film in the opening 68, electrically connected to the source/drain diffused layer 28 through the plug 52, and the plug 84 formed in the contact hole 82 of the Ru film, connected to the interconnection layer 46 through the plug 80 (FIG. 25A).

Figure 25B:
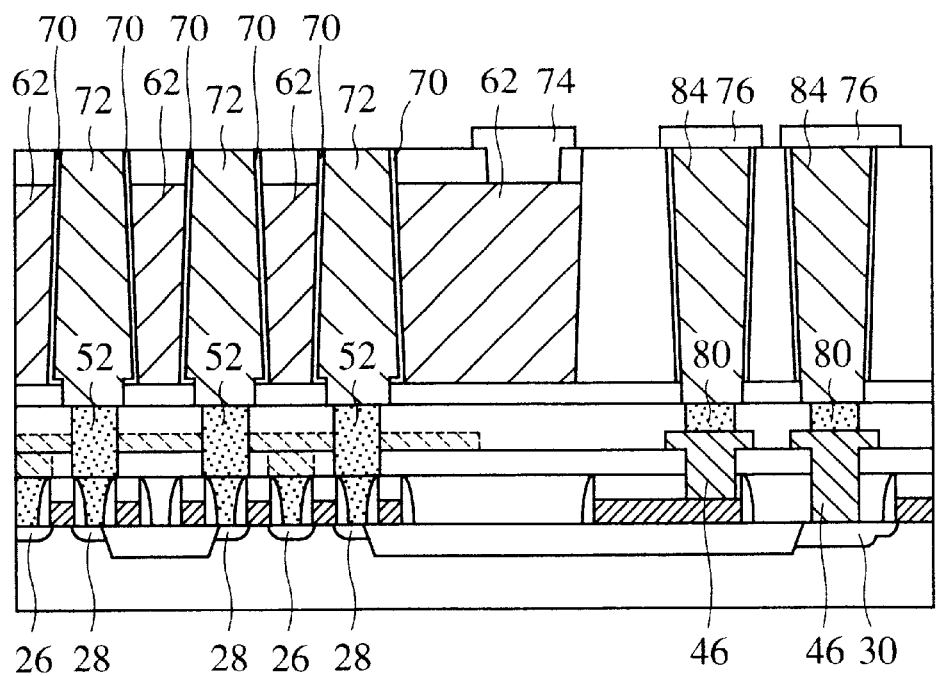

Then, as required, the interconnection layer 74 connected to the plate electrode 62, the interconnection layer 76 connected to the interconnection layer 46 through the plug 84, etc. are formed (FIG. 25B).

Thus, a DRAM comprising memory cell each including one transistor and one capacitor is fabricated.

As described above, according to the present invention, the plug 84 for leading out the interconnection layer 46 of the peripheral circuit is formed of the conducting layer as the storage electrode, whereby it is not necessary to add the step for forming a deep contact hole for connecting the interconnection layer 76 of the peripheral circuit to the interconnection layer 46. When the structure in which the plug is buried in the contact hole is used in the method for fabricating the semiconductor device according to the first embodiment, the step of burying the conducting film to be the pug must be added. However, the present embodiment can omit this step.

In the present embodiment, the plug 84 and the storage electrode 72 are formed of the same conducting layer in the semiconductor device according to the first embodiment, but this is also applicable to the semiconductor device according to the second to the fourth embodiments.

A Sixth Embodiment

The semiconductor device and the method for fabricating the same according to a sixth embodiment of the present invention will be explained with reference to FIGS. 26, 27A–27B, 28A–28B, and 29A–29B. The same members of the present embodiment as those of the semiconductor device and the method for fabricating the same according to the first to the fifth embodiments are represented by the same reference numbers to repeat or to simplify their explanation.

Figure 26:
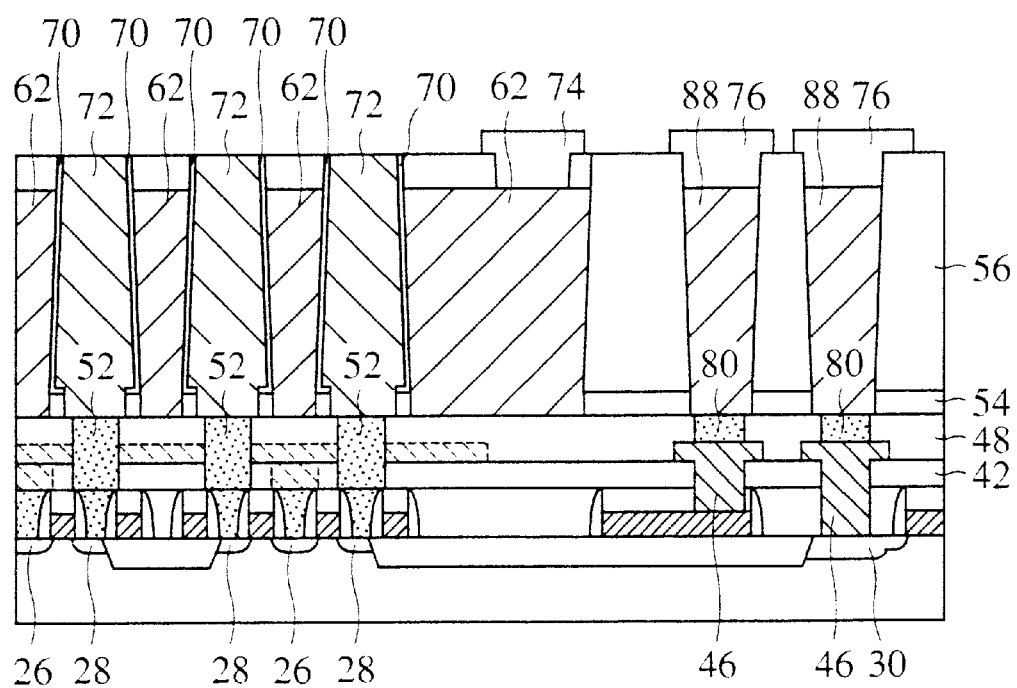
FIG. 26 is a diagrammatic sectional view of the semiconductor device according to a sixth embodiment of the present invention, which shows a structure thereof.

FIG. 26 is a diagrammatic sectional view of the semiconductor device according to the present embodiment, which show a structure thereof. FIGS. 27A–27B, 28A–28B, and 29A–29B are sectional views of the semiconductor device according to the present embodiment in the steps of the method for fabricating the same, which show the method.

The semiconductor device according to the present embodiment is characterized in that, as shown in FIG. 26, an interconnection layer 76 of a peripheral circuit region is connected to an interconnection layer 46 through a plug 88 of the conducting layer forming a plate electrode 62. The structure of the semiconductor device makes it unnecessary to form a deep contact hole for connecting the interconnection layer 76 of the peripheral circuit to the interconnection layer 46. This adds no fabrication step. The use of this structure of burying the plug in the contact hole in the method for fabricating the semiconductor device according to the first embodiment requires an additional step of burying a conducting film to be the plug. The present embodiment can omit this step.

Next, the method for fabricating the semiconductor device according to the present embodiment will be explained with reference to FIGS. 27A–27B, 28A–28B, and 29A–29B.

Figure 27A:
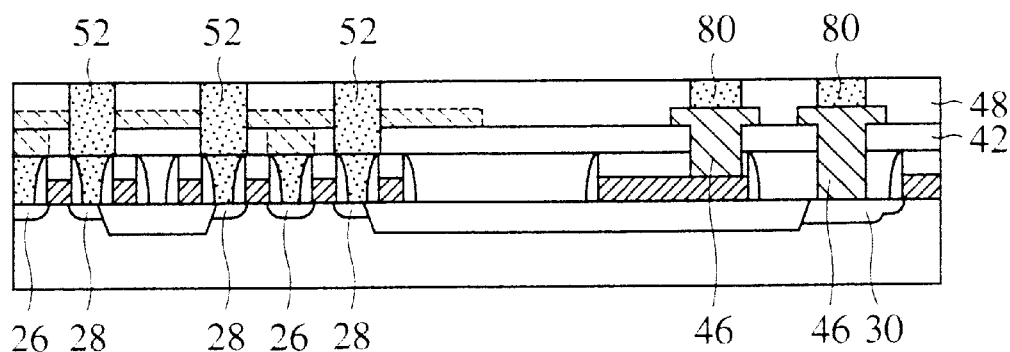
FIGS. 27A–27B, 28A–28B, and 29A–29B are sectional views of the semiconductor device according to the sixth embodiment of the present invention in the steps of the method for fabricating the same, which show the method.

First, in the same way as, e.g., in the method for fabricating the semiconductor device according to the first embodiment shown in FIG. 4A to FIG. 5B, a memory cell transistor, a peripheral circuit transistor, a bit line 44, an interconnection layer 46, a plug 52, etc. are formed. At this time, in the steps shown in FIGS. 5A and 5B, the plug 52 and a plug 80 are simultaneously formed, connected respectively to the plug 40 and the interconnection layer 46 (FIG. 27A).

Next, an etching stopper film 54 of a silicon nitride film, an inter-layer insulation film 56 of a silicon oxide film and a mask film 58 of an amorphous silicon film are formed on the inter-layer insulation film 48 by, e.g., CVD method.

Figure 27B:
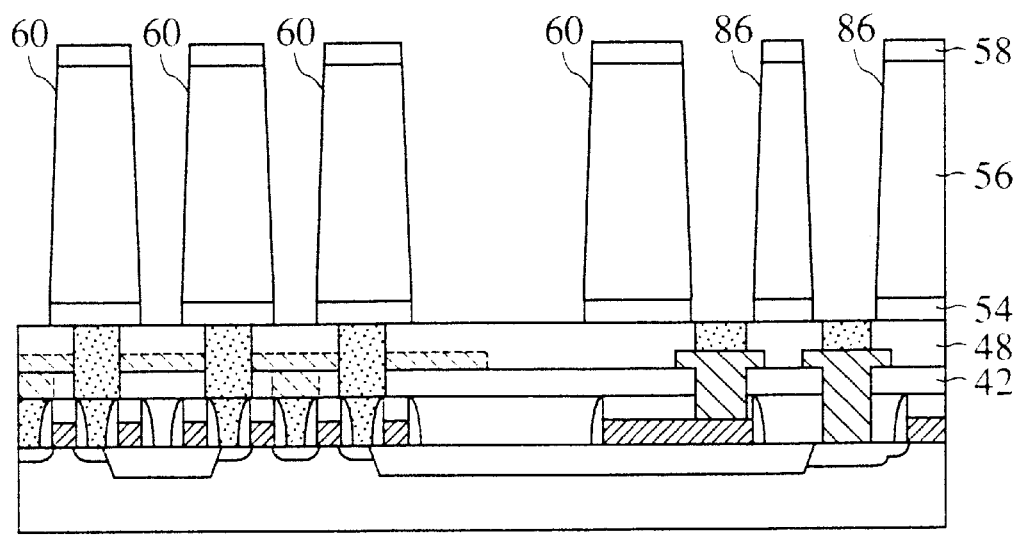

Then, the mask film 58, the inter-layer insulation film 56 and the etching stopper film 54 are patterned by the lithography and etching to form an openings 60, 86 down to the inter-layer insulation film 48 and the plug 80 (FIG. 27B). A region for the opening 60 formed in corresponds to a region for a plate electrode 62 formed in, and a region for the opening 86 formed in corresponds to a region for a contact hole for the peripheral circuit to be formed in.

Next, the photoresist film (not shown) which has been used in forming the opening 60 is removed by, e.g., plasma ashing, and the mask film 58 of amorphous silicon film is removed by, e.g., dry etching.

Figure 28A:
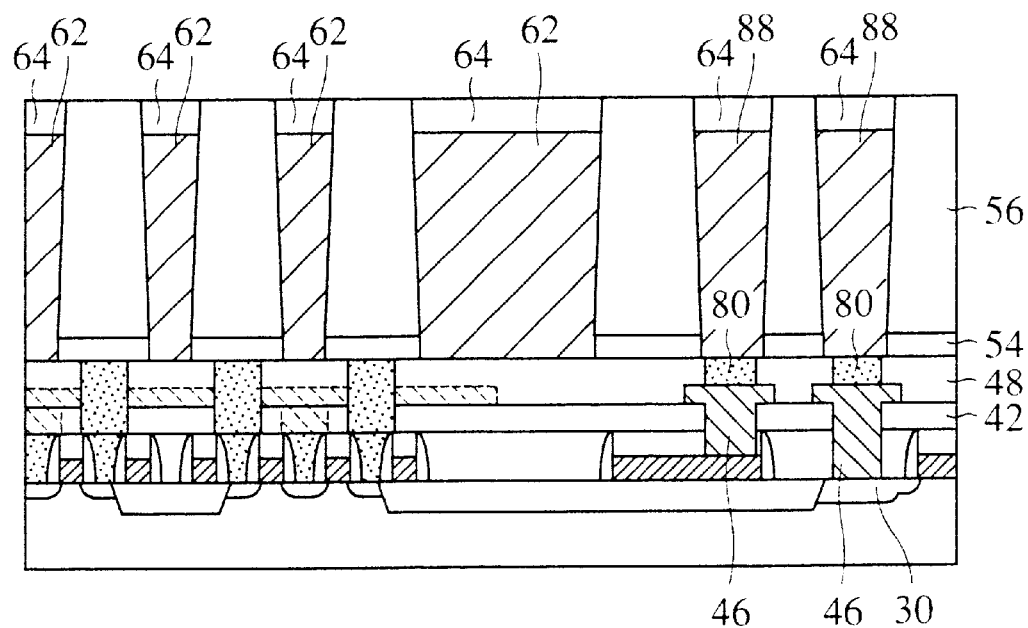

Next, in the same way as, e.g., in the method for fabricating the semiconductor device shown in FIGS. 6A and 6B, the plate electrode 62 is formed, buried in the opening 60 and having he upper surface covered by the silicon nitride film 64. At this time, the conducting film which is the same conducting film as the plate electrode 62 and the silicon nitride film are also buried in the opening 86. A plug 88 and the silicon nitride film covering the upper surface of the plug 88 are formed in, the opening 86 (FIG. 28A).

Figure 28B:
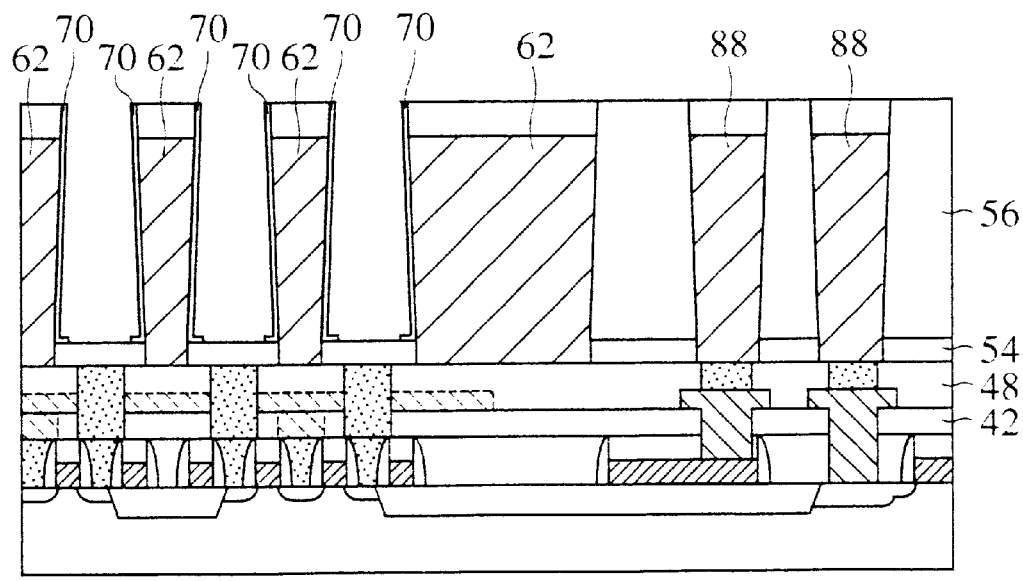

Then, in the same way as, e.g., in the method for fabricating the semiconductor device according to the first embodiment shown in FIG. 7A, the inter-layer insulation 56 in the memory region is removed to form the opening 68, and the capacitor dielectric film 70 is formed selectively on the inside wall of the opening 86 (FIG. 28B).

Next, thermal treatment is performed for sufficiently crystallizing the capacitor dielectric film 70 and supplementing oxygen defects of the capacitor dielectric film. At this time, the plug 52 covered by the silicon nitride film, which is known as an oxidation mask, is not oxidized. The storage electrode 72 has not been formed yet, and electric characteristics between the plug 52 and the storage electrode 72 are not deteriorated.

Figure 29A:
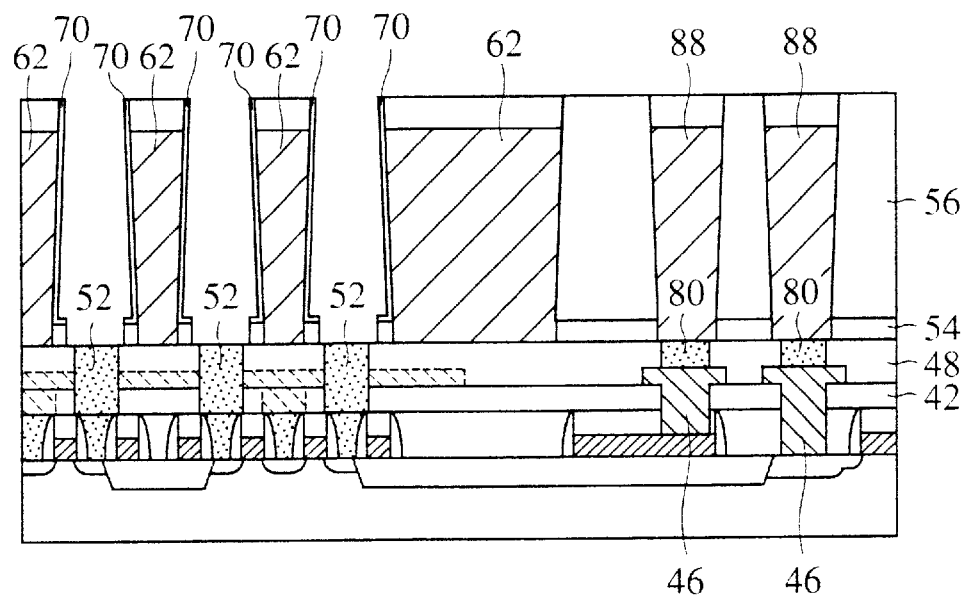

Then, the etching stopper film 54 exposed in the opening 68 is removed by anisotropic etching, such as RIE or others. To expose the plug 52 in the opening 68 (FIG. 29A).

Figure 29B:
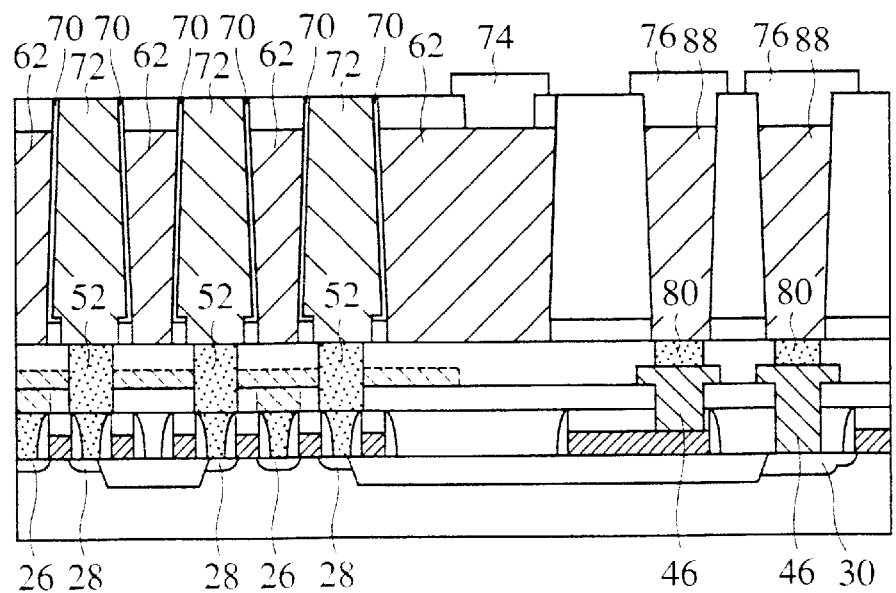
Figure 30A:
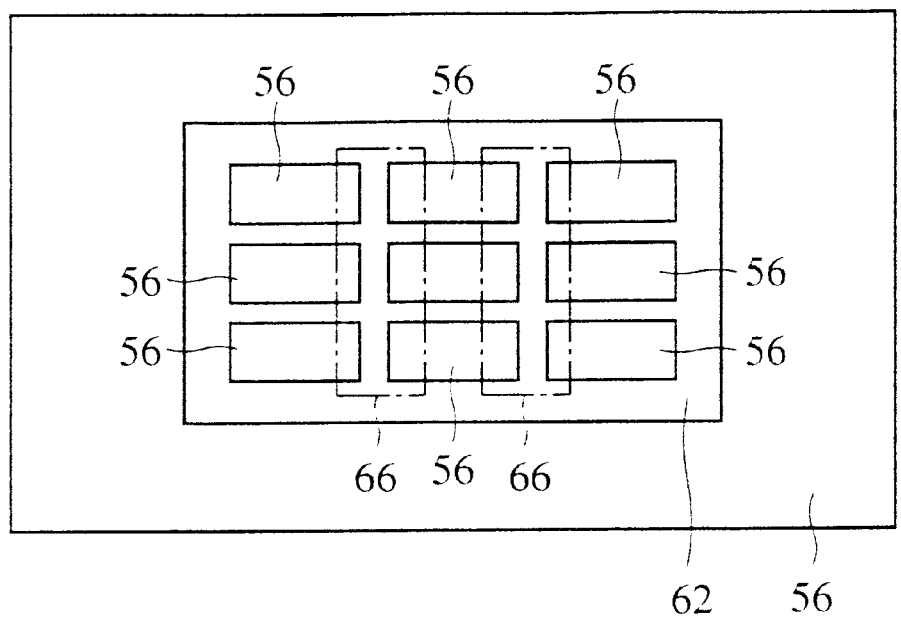
FIGS. 30A–30B and 31A–31B are views of examples of patterns of the photoresist film used in the method for fabricating the semiconductor device according to a modifications of the embodiments of the present invention.
Figure 30B:
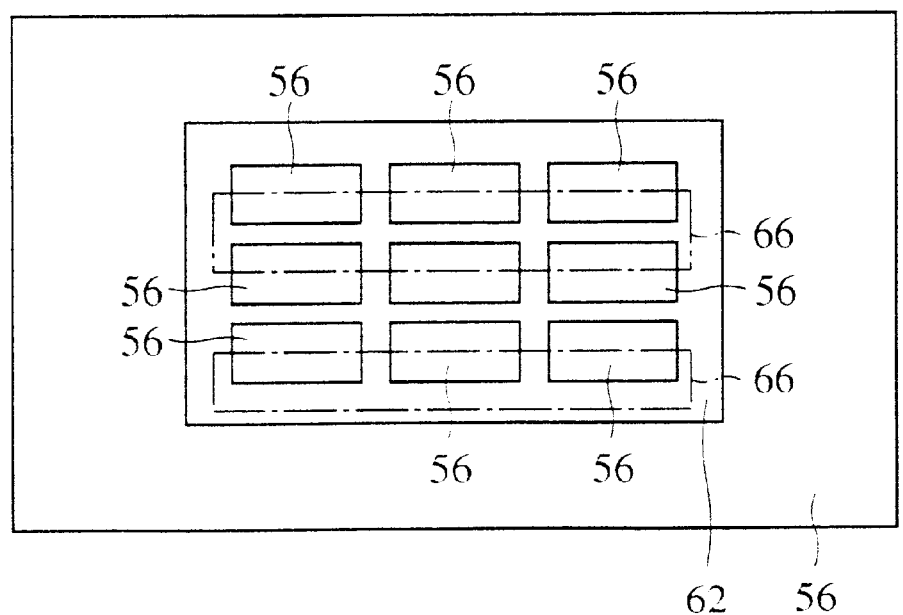

Next, in the same way as, e.g., in the method for fabricating the semiconductor device according to the first embodiment shown in FIGS. 8A and 8B, the storage electrode 72 buried in the opening 68, the interconnection layer 74 connected to the plate electrode 62, the interconnection layer 76 connected to the interconnection layer 46 through the plugs 88, 80, etc. are formed (FIG. 29B).

Thus, a DRAM comprising memory cell each including one transistor and one capacitor is fabricated.

As described above, according to the present embodiment, the plug 88 for leading out the interconnection layer 46 of the peripheral circuit is formed of the conductor layer forming the plate electrode 62, whereby the additional step of forming a deep contact hole for connecting the interconnection layer 76 to the interconnection layer 46 of the peripheral circuit is not necessary. When the structure of burying the plug in the contact hole is applied to the method for fabricating the semiconductor device according to the first embodiment, the step of burying the conducting film to be the plug must be added, but the present embodiment can omit this step.

In the present embodiment, the semiconductor device according to the first embodiment has the plug 88 formed of the conducting layer forming the plate electrode 62, and this may be also applied to the semiconductor device according to the second to the fourth embodiments.

Modifications

The present invention is not limited to the above-described embodiments and cover other various modifications.

For example, in the first embodiment, after the capacitor dielectric film 70 is selectively left on the side wall of the opening 68 by anisotropic etching, the thermal treatment for sufficiently crystallizing the capacitor dielectric film 70 and supplementing oxygen defects of the capacitor dielectric film is performed. However, the thermal oxidation does not essentially follow the anisotropic etching of the capacitor dielectric film 70. The thermal treatment for sufficiently crystallizing the capacitor dielectric film 70 and supplementing oxygen defects of the capacitor dielectric film may be performed at least after the capacitor dielectric film 70 is deposited and before the storage electrode 72 is formed. The timing can be suitable selected corresponding to materials forming the capacitor.

For example, in the method for fabricating the semiconductor device according to the first to the sixth embodiments, the thermal oxidation may be performed immediately after the capacitor dielectric film is deposited, formed on the entire surface. In this case, because the dielectric film 70 is left over a large area, orientations of crystals of the capacitor dielectric film 70 can be made uniform. This is a merit.

In the method for fabricating the semiconductor device according to the first, and the fourth to the sixth embodiments, when the thermal processing in an oxidizing atmosphere is unnecessary, the capacitor dielectric film 70 is not formed in a step corresponding to the step of FIG. 7A but, in a step corresponding to the step of FIG. 7B, is deposited after the etching stopper film 54 is removed. Then, thermal treatment may be performed with the capacitor dielectric film 70 formed on the entire surface or after anisotropic etching is performed.

Figure 17B:
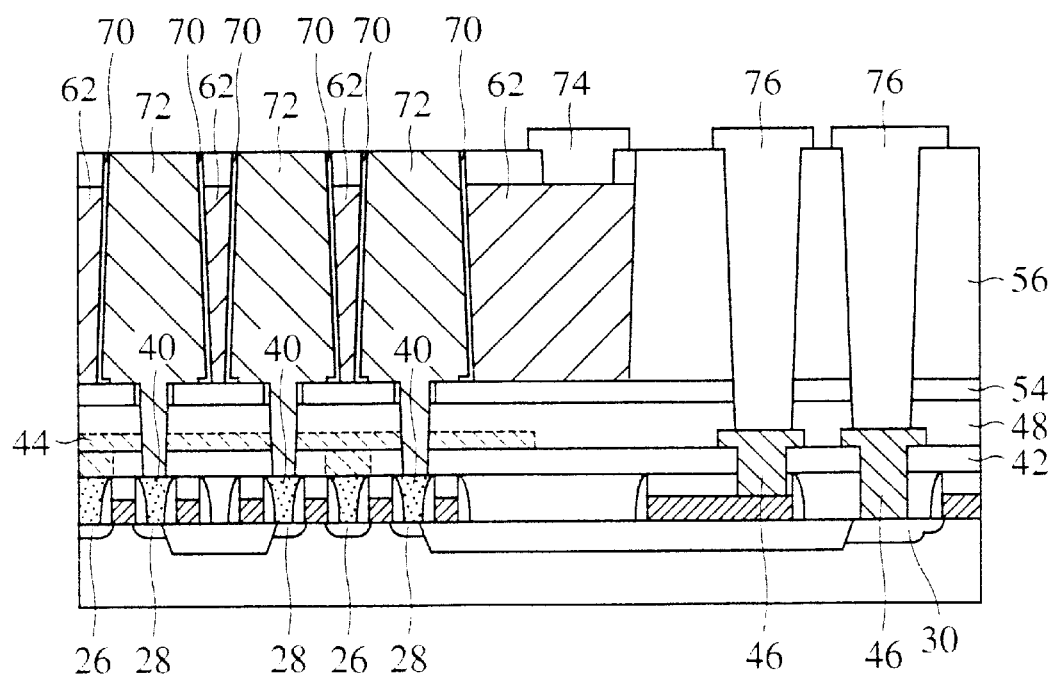

Similarly, in the method for fabricating the semiconductor device according to the second or the third embodiment, when the thermal treatment in an oxidizing atmosphere is unnecessary, the capacitor dielectric film 70 is not formed in the step of FIG. 11B or FIG. 16B, but, in the step of FIG. 12A or FIG. 17B, is deposited after the etching stopper film 54 or the inter-layer insulation films 48, 42 are removed. Then, thermal treatment may be performed with the capacitor dielectric film 70 formed on the entire surface or after anisotropic etching is performed.

In the method for fabricating the semiconductor device according to the first embodiment, the photoresist film 66 for removing the inter-layer insulation film 56 to form the opening 68 for the storage electrode to be buried in has the pattern shown in FIG. 9. However, the pattern of the photoresist film 66 is not limited to the pattern of FIG. 9.

Figure 31A:
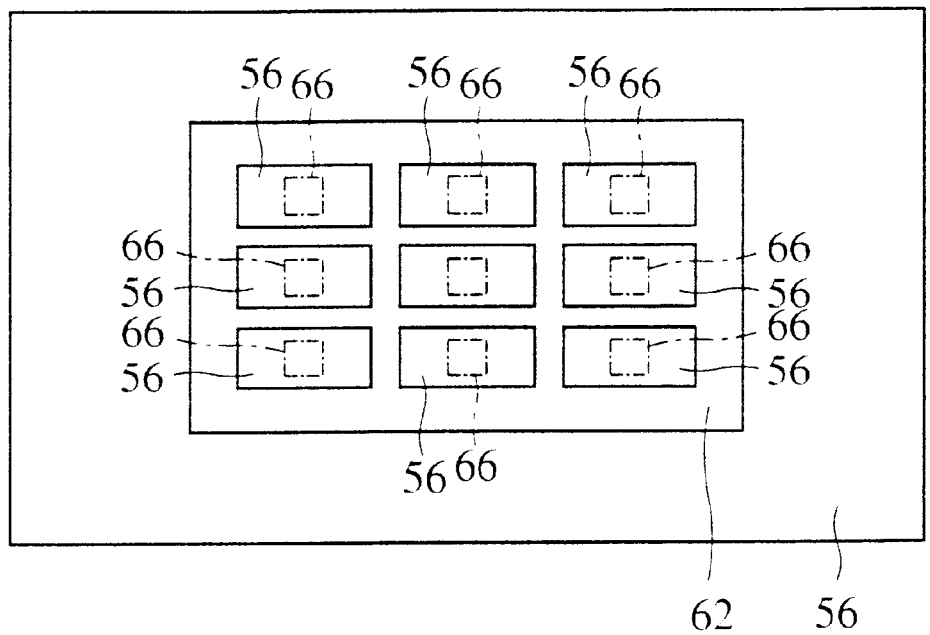
Figure 31B:
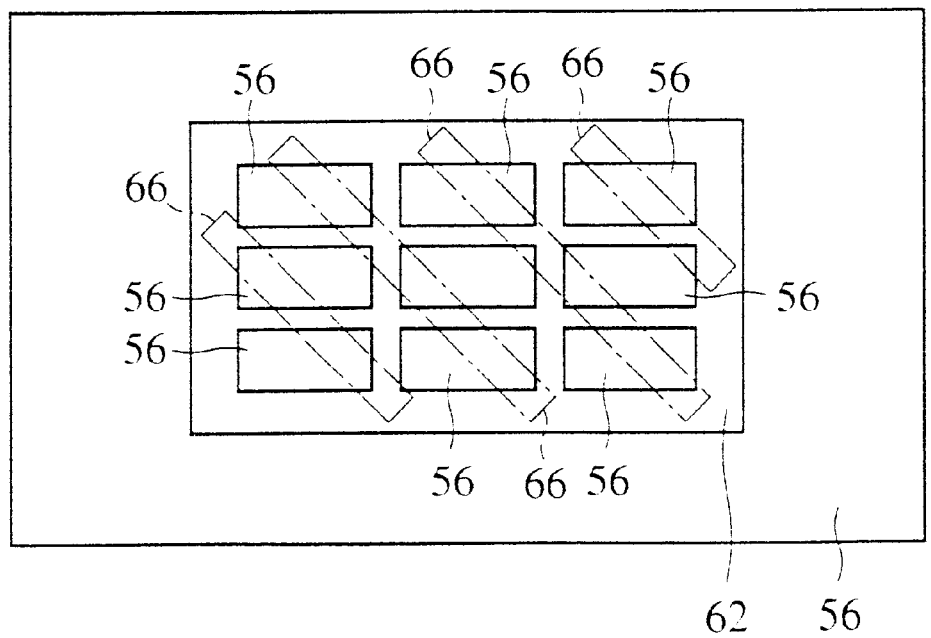
Figure 32A:
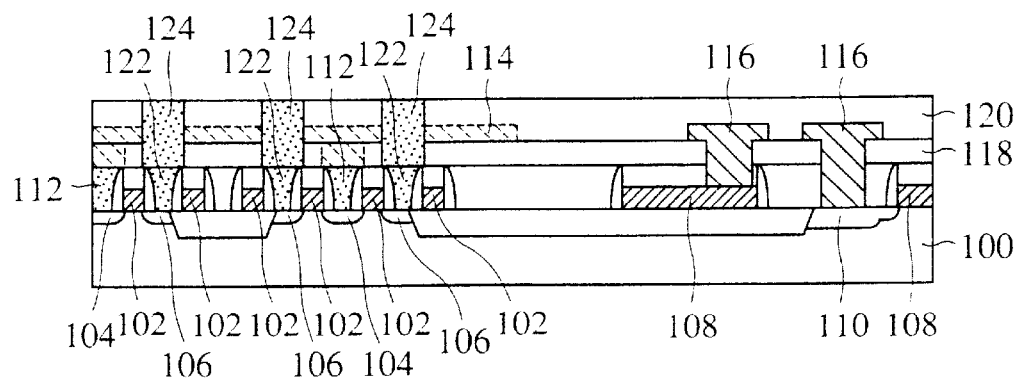
FIGS. 32A–32B, 33A–33B, 34A–34B, and 35A–35B are sectional views of the conventional semiconductor device in the steps of the method for fabricating the same, which shows the method.
Figure 32B:
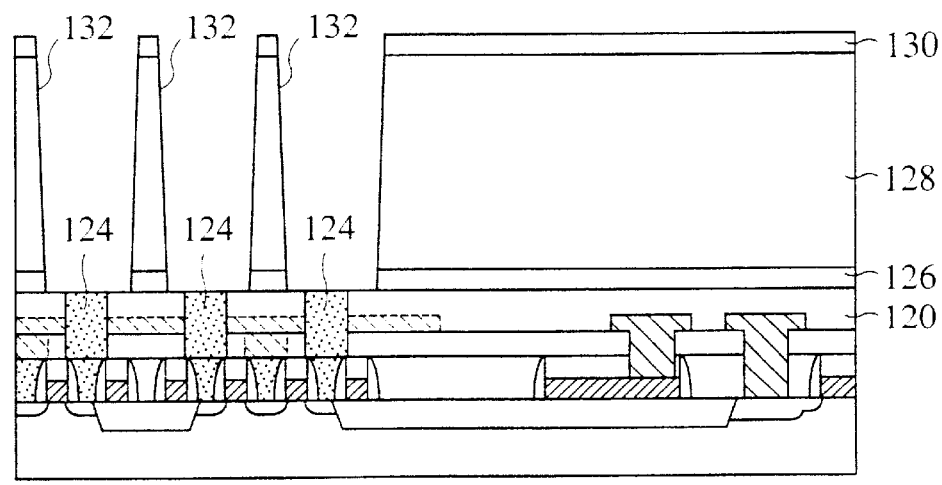
Figure 33A:
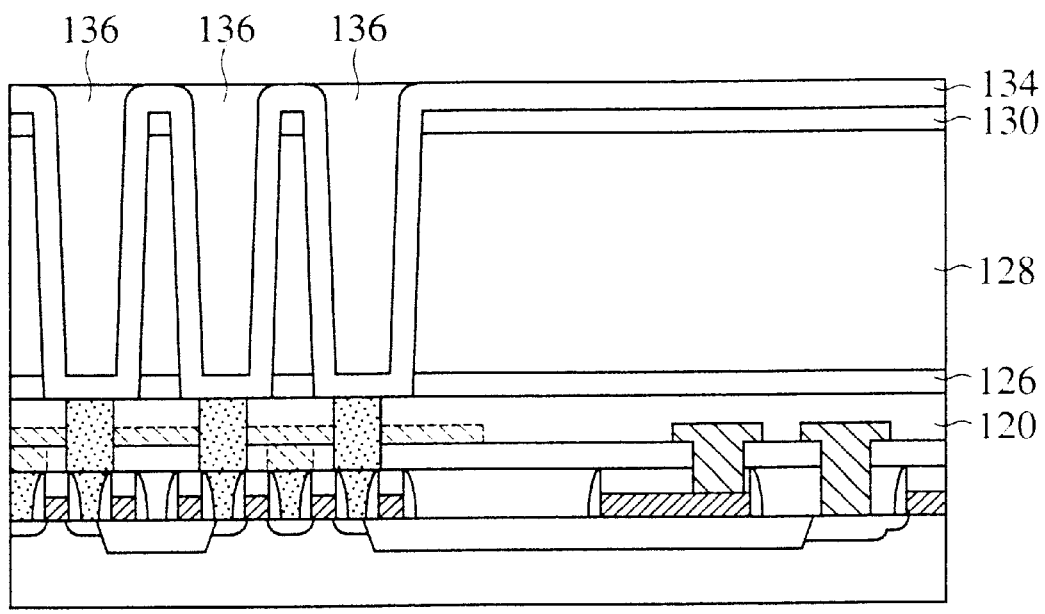
Figure 33B:
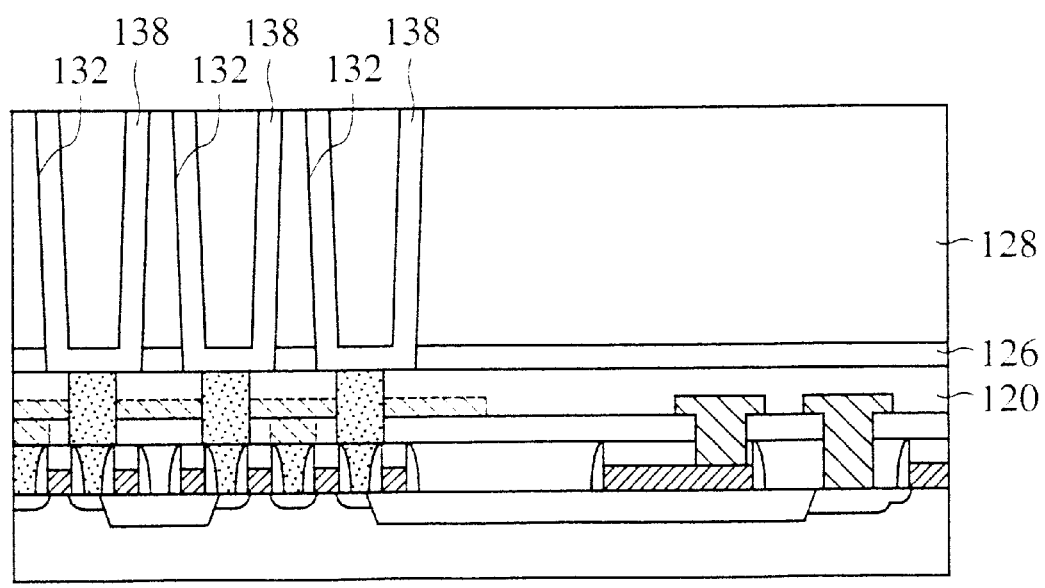
Figure 34A:
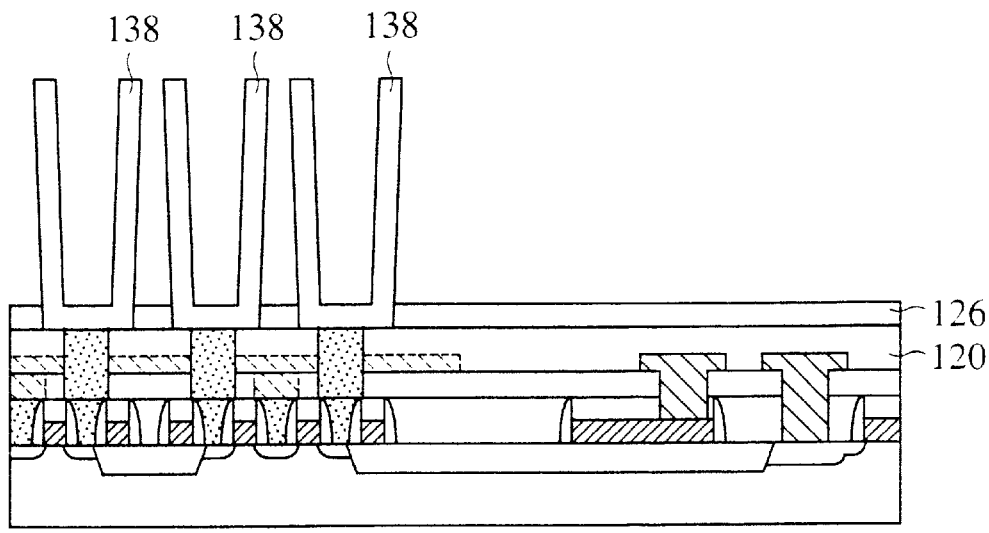
Figure 34B:
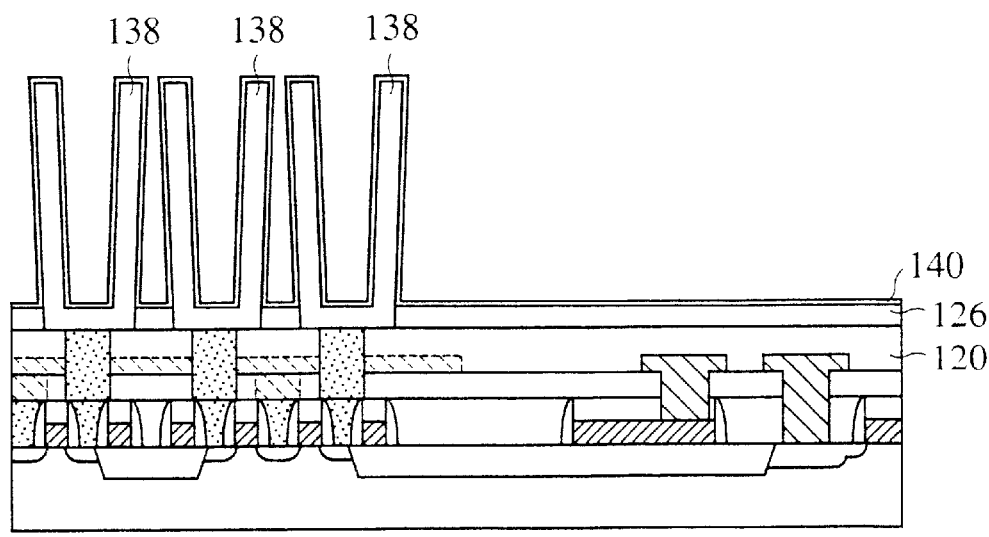
Figure 35A:
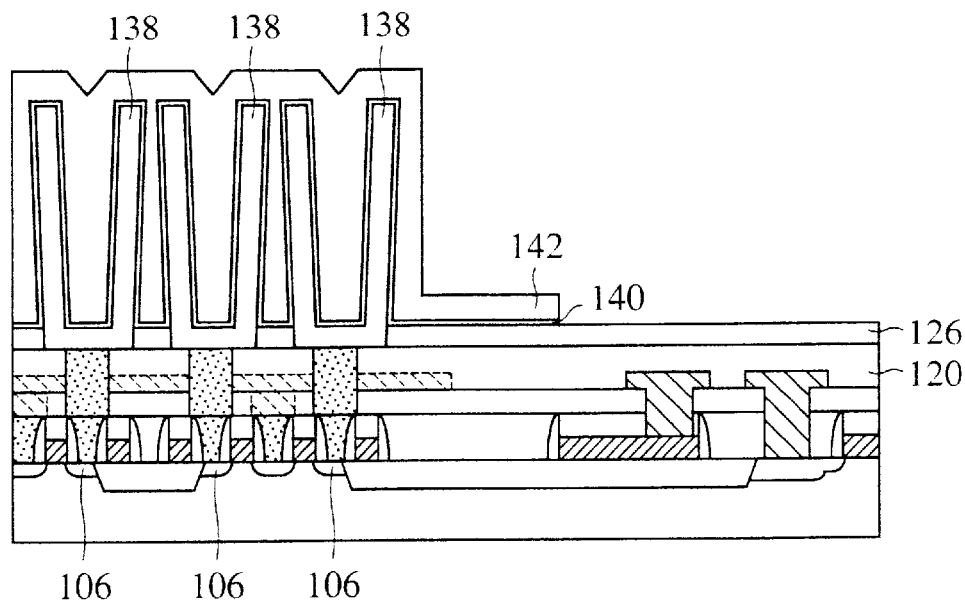
Figure 35B:
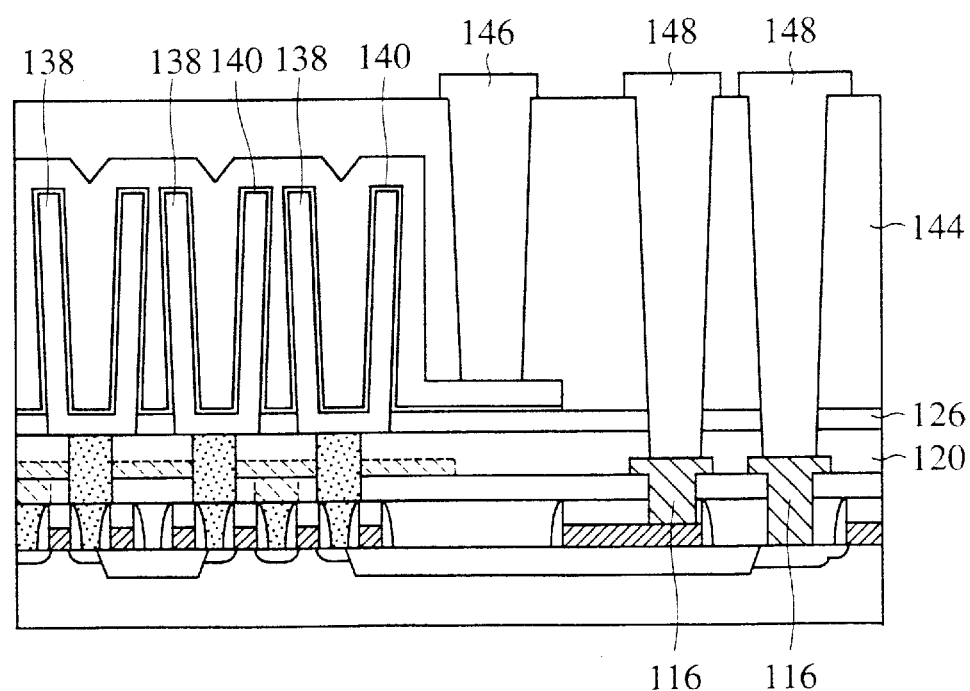

The photoresist film 66 may have any pattern as long as the photoresist film 66 can expose a part of each of pillar-shaped inter-layer insulation film 56 left in the memory cell regions. For example, the photoresist film 66 may have a pattern of stripes as shown in FIGS. 18 and 31A which are parallelly extended in the direction of extension of the word lines (gate electrodes 20). The photoresist film 66 may have a pattern of stripes as shown in FIG. 31B which are parallelly extended in the direction of extension of the bit lines. As shown in FIG. 32A, the photoresist film 66 may have a pattern having discrete openings for respective pillar-shaped inter-layer insulation film 56. As shown in FIG. 32B, the photoresist film 66 may have a pattern of stripes which are extended slant to the word liens and the bit lines.

In the first to the sixth embodiments, the side wall of the opening 60 for the plate electrode 62 to be buried in is inversely tapered but may not be essentially inversely tapered. The side wall of the opening 60 may be substantially vertical or forward tapered.

What is claimed is:

1. A semiconductor device comprising:
   an insulation film formed over a semiconductor substrate, the insulation film having an opening;
   a storage electrode having a side wall forward tapered formed over the insulation film, the storage electrode being electrically connected to the semiconductor substrate via the opening;
   a capacitor dielectric film formed on the side wall of the storage electrode and on the insulation film beneath the storage electrode; and
   a plate electrode formed on the side wall of the storage electrode with the capacitor dielectric film interposing therebetween, the plate electrode having a side wall inversely tapered.

2. A semiconductor device comprising:
   a first insulation film formed over a semiconductor substrate, the first insulation film having openings;
   storage electrodes each having a side wall forward tapered formed over the first insulation film, each of the storage electrodes being electrically connected to the semiconductor substrate via the opening;
   a capacitor dielectric film formed on the side wall of the storage electrodes and on the first insulation film beneath the storage electrodes; and
   a plate electrode formed on the side wall of the storage electrodes with the capacitor dielectric film interposing therebetween, the plate electrode having a side wall inversely tapered.

3. A semiconductor device according to claim 2, wherein the first insulation film has a first film and a second film formed on the first film;
   each of the storage electrodes is formed in the opening at the second film and electrically connected to the semiconductor substrate via a conductive plug buried in the opening at the first film.

4. A semiconductor device according to claim 3, wherein the conductive plugs are formed of the same conducting layer as the storage electrodes.

5. A semiconductor device according to claim 3, wherein the capacitor dielectric film is formed on the side wall of the openings.

6. A semiconductor device according to claim 3, wherein the plate electrode is formed along the side wall of the storage electrodes and an upper face of the first insulation film,
   a region between the storage electrodes is buried by the plate electrode and a second insulation film formed on the plate electrode.

7. A semiconductor device according to claim 6, further comprising:
   an interconnection layer electrically connected to the plate electrode at a region where the plate electrode is formed along the upper face of the first insulation film.

8. A semiconductor device comprising:
   a semiconductor substrate including a first region and a second region:
      a capacitor formed in the first region including a storage electrode having a side wall forward tapered;

a capacitor dielectric film formed on the side wall of the storage electrode; and a plate electrode formed on the side wall of the storage electrode with the capacitor dielectric film interposing therebetween, the plate electrode having a side wall inversely tapered; and an interconnection layer formed in the second region and formed of the same conducting layer as the storage electrode, the interconnection layer is electrically connected to the semiconductor substrate in the second region or a conducting layer formed in the second region.

9. A semiconductor device comprising:

a semiconductor substrate including a first region and a second region;

a capacitor formed in the first region including a storage electrode having a side wall forward tapered; a capacitor dielectric firm formed on the side wall of the storage electrode; and a plate electrode formed on the side wall of the storage electrode with the capacitor dielectric film interposing therebetween, the plate electrode having a side wall inversely tapered; and an interconnection layer formed in the second region and formed of the same conducting layer as the plate electrode, the interconnection layer is electrically connected to the semiconductor substrate in the second region or a conducting layer formed in the second region.

* * * * *